(12) United States Patent
Hayashi et al.

(10) Patent No.: US 7,378,745 B2
(45) Date of Patent: May 27, 2008

(54) PACKAGE SUBSTRATE FOR A SEMICONDUCTOR DEVICE HAVING THERMOPLASTIC RESIN LAYERS AND CONDUCTIVE PATTERNS

(75) Inventors: Akimori Hayashi, Kanagawa (JP); Katsunobu Suzuki, Kanagawa (JP); Ryuichi Oikawa, Kanagawa (JP); Makoto Nakagoshi, Kanagawa (JP); Naoko Sera, Kanagawa (JP); Tadashi Murai, Kanagawa (JP); Chiho Ogihara, Kanagawa (JP); Ryohei Kataoka, Kariya (JP); Koji Kondo, Kariya (JP); Tomohiro Yokochi, Kariya (JP)

(73) Assignees: NEC Electronics Corporation, Kanagawa (JP); Denso Corporation, Aichi (JP)

( * ) Notice: Subject to any disclaimer, the term of this patent is extended or adjusted under 35 U.S.C. 154(b) by 233 days.

(21) Appl. No.: 11/213,867

(22) Filed: Aug. 30, 2005

(65) Prior Publication Data

US 2006/0044735 A1 Mar. 2, 2006

(30) Foreign Application Priority Data

Aug. 31, 2004 (JP) ............................. 2004-252568

(51) Int. Cl.
*H01L 23/48* (2006.01)
*H01L 23/52* (2006.01)
*H01L 29/40* (2006.01)
*H01L 23/053* (2006.01)
*H01L 23/12* (2006.01)
*H01L 23/29* (2006.01)

(52) U.S. Cl. ...................... 257/778; 257/700; 257/738; 257/748; 257/773; 257/774; 257/781; 257/786; 257/790

(58) Field of Classification Search ................ 257/700, 257/738, 748, 778, 786, 790, 773–774, 781
See application file for complete search history.

(56) References Cited

U.S. PATENT DOCUMENTS 5,672,911 A * 9/1997 Patil et al. ................... 257/691

(Continued)

FOREIGN PATENT DOCUMENTS

JP 2000-038464 2/2000

(Continued)

OTHER PUBLICATIONS

"Microelectronics Packaging Handbook" Japanese Version, pp. 375-411 Rao R. Tummala, Eugene J. Rymaszewski, and Alan G. Klopfenstein.

(Continued)

*Primary Examiner*—Ida M Soward
(74) *Attorney, Agent, or Firm*—Young & Thompson

(57) ABSTRACT

A plurality of film insulators having conductive patterns that are formed on surfaces and conductive vias that pass through the film insulators in the direction of thickness are stacked together and collectively subjected to pressure and heat to be formed as a single unit. On one outermost layer of the multilayer board that has been thus formed, a plurality of connection terminals are exposed to the outside, connection bumps of an LSI chip being secured to these connection terminals. On the outermost layer of the opposite side, a multiplicity of metal pads are provided, and a solder ball is secured on each metal pad to form a ball grid array (BGA) structure for connecting to a motherboard.

21 Claims, 22 Drawing Sheets

U.S. PATENT DOCUMENTS

| | | | | |
|---|---|---|---|---|
| 5,847,936 | A * | 12/1998 | Forehand et al. | 361/794 |
| 5,939,782 | A * | 8/1999 | Malladi | 257/698 |
| 6,271,478 | B1 * | 8/2001 | Horiuchi et al. | 174/255 |
| 6,486,534 | B1 * | 11/2002 | Sridharan et al. | 257/659 |
| 6,512,182 | B2 * | 1/2003 | Takeuchi et al. | 174/256 |
| 6,535,398 | B1 * | 3/2003 | Moresco | 361/792 |
| 6,639,155 | B1 * | 10/2003 | Bupp et al. | 174/260 |
| 6,750,403 | B2 * | 6/2004 | Peterson | 174/255 |
| 6,781,218 | B1 * | 8/2004 | Wilsher | 257/662 |
| 6,909,054 | B2 * | 6/2005 | Sakamoto et al. | 174/260 |
| 6,941,537 | B2 * | 9/2005 | Jessep et al. | 715/15 |
| 6,965,169 | B2 * | 11/2005 | Lu et al. | 257/778 |
| 7,187,559 | B2 * | 3/2007 | Hirabayashi et al. | 361/780 |
| 7,193,311 | B2 * | 3/2007 | Ogawa et al. | 257/687 |
| 2001/0008309 | A1 * | 7/2001 | Iijima et al. | 257/737 |
| 2003/0104652 | A1 * | 6/2003 | LeBonheur et al. | 438/108 |
| 2003/0168748 | A1 * | 9/2003 | Katagiri et al. | 257/778 |
| 2003/0170450 | A1 | 9/2003 | Stewart et al. | 428/343 |
| 2004/0105955 | A1 | 6/2004 | Ho et al. | 428/101 |
| 2004/0207094 | A1 * | 10/2004 | Sugizaki et al. | 257/774 |
| 2004/0212075 | A1 * | 10/2004 | Shiraishi et al. | 257/700 |
| 2004/0227227 | A1 * | 11/2004 | Imanaka et al. | 257/700 |
| 2006/0023439 | A1 * | 2/2006 | Fraley et al. | 361/780 |
| 2007/0194433 | A1 * | 8/2007 | Suwa et al. | 257/700 |

FOREIGN PATENT DOCUMENTS

| | | |
|---|---|---|
| JP | 2002-118194 | 4/2002 |
| JP | 2003-209356 | 7/2003 |
| JP | 2003-273511 | 9/2003 |
| JP | 2003-318538 | 11/2003 |
| JP | 2003-324280 | 11/2003 |
| JP | 2004-064009 | 2/2004 |
| JP | 2004-095963 | 3/2004 |
| JP | 2004-158671 | 6/2004 |
| KR | 97-11619 | 7/1997 |
| KR | 2003-60268 | 7/2003 |

OTHER PUBLICATIONS

"Microelectronics Packaging Handbook" Japanese Version, pp. 375-411 Rao R. Tummala, Eugene J. Rymaszewski, and Alan G. Klopfenstein, Dec. 1989.

* cited by examiner

Relation between linear expansion coefficient and tensile stress of thermoplastic resin layer Relation between linear expansion coefficient × Modulus of elasticity and tensile stress of thermoplastic resin layer

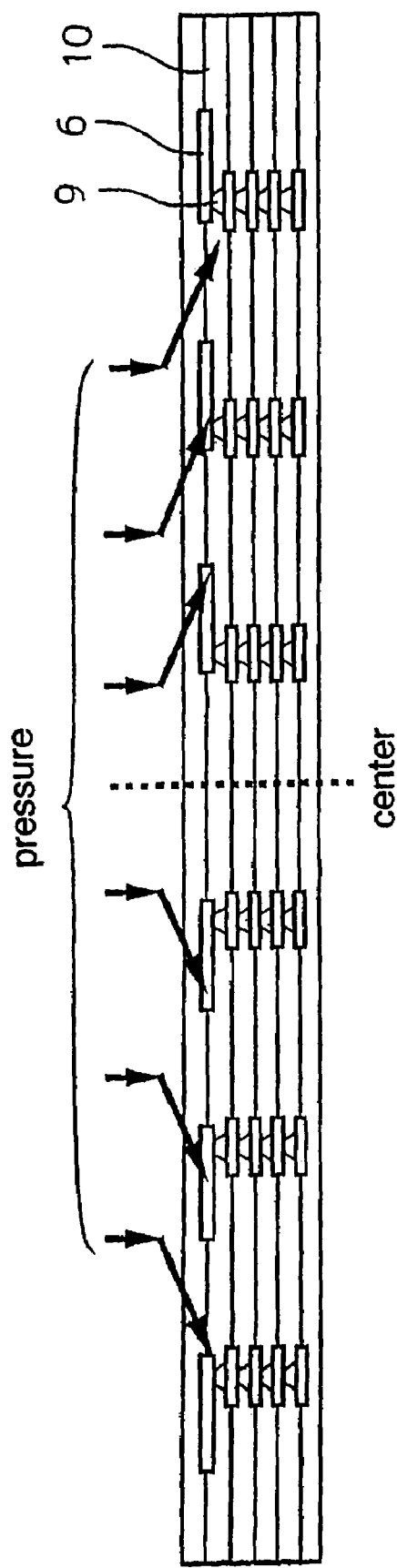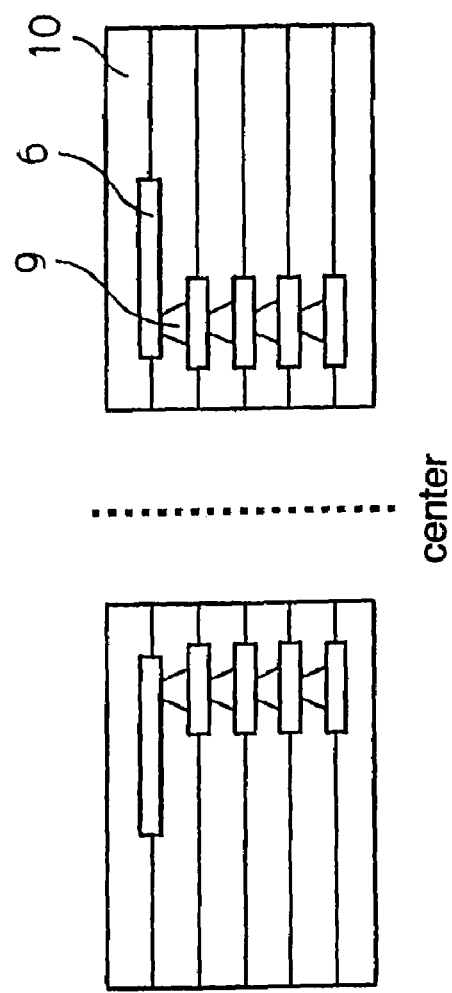
Fig. 24A
Fig. 24B

PACKAGE SUBSTRATE FOR A SEMICONDUCTOR DEVICE HAVING THERMOPLASTIC RESIN LAYERS AND CONDUCTIVE PATTERNS

BACKGROUND OF THE INVENTION

1. Field of the Invention

The present invention relates to a package substrate for a semiconductor device in which integrated circuit elements are mounted, to a method of fabricating the package substrate, and to a semiconductor device that includes the package substrate for a semiconductor device.

2. Description of the Related Art

Packages are conventionally used for incorporating integrated circuit elements such as LSI chips and connecting the integrated circuit elements to what is called a "motherboard" (circuit board). Such a package incorporates a multilayer board on which various signal lines, ground patterns, and power-supply patterns have been formed. The integrated circuit elements and motherboard are connected by way of this multilayer board.

Multilayer boards for packaging of the prior art include the built-up type of multilayer board that is disclosed in, for example, Japanese Patent Application Laid-Open No. 2004-158671 (see FIG. 1). In a built-up multilayer board, substrate layers (layers of an organic material composed of, for example, epoxy resin) 102 composed of, for example, prepreg are successively laminated on both sides of thick core material 101 that serves as a base. An actual method of fabricating a built-up multilayer board is as follows: First, a thermosetting epoxy resin is impregnated in a glass cloth and cured to form core material 101 that is composed of glass epoxy resin. This core material 101 is of a multilayer construction having internal copper foil layers as necessary. Conductive patterns are formed of copper foil on both sides of core material 101, and through-holes 103 that pass through core material 101 are formed to interconnect the conductive patterns on the two sides of core material 101. Through-holes 103 are formed by opening holes in core material 101 by laser irradiation or by a drill and then depositing a metal layer by plating the interior walls of these through-holes. Causing portions of this metal layer to contact each of the conductive patterns on both sides of core material 101 electrically connects the conductive patterns on the two sides of core material 101.

Multilayering is realized by successively forming (building up) a plurality of substrate layers 102 of prepreg having conductive patterns 105 that are composed of, for example, copper foil on core material 101 that has been formed in this way. Through-holes are formed in substrate layers 102 in the direction of thickness, and vias 104 are formed by embedding metal in these through-holes. Vias 104 connect conductive patterns 105 that are located on the upper layers of substrate layers 102 and conductive patterns 105 that are located on the lower layers. By this method, a plurality of layers of substrate layers 102 that are composed of, for example, a prepreg and conductive patterns 105 that are formed of, for example, copper foil are formed on both sides of core material 101, and each layer of these conductive patterns 105 are connected by vias 104 to form a multilayer board.

In the configuration that is disclosed in Japanese Patent Laid-Open Publication No. 2004-158671, in contrast to the configuration that is shown in FIG. 1, conductive patterns 105 on the both sides of substrate layer 102 are connected by forming through-holes in substrate layer 102 that are similar to the through-holes in core material 101.

Another package substrate of the prior art is a multilayer board in which a multiplicity of ceramic layers are laminated (see FIG. 2) as disclosed in the Japanese Patent Laid-Open Publication No. 2002-118194. As the actual method of fabricating this multilayer board, a metal such as silver or tungsten is printed on a presintering sheet called a "green sheet" to form conductive patterns 106. Through-holes are next formed at prescribed positions of the green sheet by laser irradiation or punching, and metal is embedded in these through-holes to form vias 107. Vias 107 connect conductive patterns 106 that are located on the upper layers of the green sheet and conductive patterns 106 that are located on the lower layers. After stacking a multiplicity of green sheets in which conductive patterns 106 and vias 107 have been formed in this way, the green sheets are sintered to cure the green sheets all at one time. In this way, a multilayer board can be formed from ceramic 108.

The following explanation regards an example of a configuration that employs a multilayer board described above as the package substrate for a semiconductor device. A plurality of connection terminals 110 are provided on one of the outermost layers of a multilayer board for electrically connecting with solder bumps 116 when mounting integrated circuit elements 109 of the flip-chip connection type, these connection terminals 110 being exposed to the outside. A plurality of metal pads 111 are provided on the outermost layer on the opposite side of this multilayer board, and solder balls (ball terminals) 112 are mounted and secured on these metal pads 111. A ball grid array (BGA) structure for connecting with a motherboard is thus formed. In this way, a package substrate for a semiconductor device can be completed.

Japanese Patent Application Laid-Open No. 2000-038464 discloses a printed wiring board in which conductive patterns are formed on the surfaces of film insulators composed of polyarylketone and polyetherimide, and these film insulators are then laminated in a plurality of layers.

The built-up multilayer board such as disclosed in the example of Japanese Patent Application Laid-Open No. 2004-158671 involves the formation of core material 101 followed by the successive formation of a plurality of substrate layers 102 and therefore necessitates an extremely time-consuming fabrication process and high fabrication costs. For example, this method is inefficient and impractical when fabricating a multilayer board having ten or more layers, and in particular, thirteen or more layers.

According to Japanese Patent Application Laid-Open No. 2004-158671, core material 101 must have sufficient strength and thickness for the laminated formation of a multiplicity of substrate layers 102. Core material 101 formed from only epoxy resin would therefore have insufficient strength, and a multilayer construction incorporating metal layers and further incorporating glass cloth is therefore adopted to obtain sufficient strength. However, the adoption of core material 101 having a multilayer construction is not preferable due to the further increase in fabrication time and fabrication costs. In addition, the incorporation of glass cloth in core material 101 raises the concern that penetration by moisture might lead to the occurrence of dendrites. To prevent the problem of dendrites, the pitch between through-holes 103 must be made at least 0.80 mm. This requirement interferes with the high-density wiring and prevents an adequate response to the demand for a more compact semiconductor device package.

In addition, because core material 101 is thick, the formation of vias by embedding metal in through-holes becomes problematic due to the difficulty of the fabrication steps and the amount of metal material that must be used. The inner circumference of through-holes is therefore covered by metal foil to form through-holes 103. In other words, the through-holes have a structure that is not filled, and vias 104 therefore cannot be formed directly above and directly below through-holes 103. The arrangement of a multiplicity of vias 104 in a direct line in the direction of thickness is therefore physically impossible due to the interposition of the locations of the holes of through-holes 103. As a result, vias 104 of each layer cannot all be formed in the same planar positions, but must be shifted within the plane. As a result, the connection of a multiplicity of layers of conductive patterns 105 on one surface of core material 101 to a multiplicity of layers of conductive patterns 105 on the other surface cannot be realized with good space efficiency. This construction therefore suffers from the problem of poor freedom degree of design.

In addition, when flip-chip integrated circuit elements 109 are mounted on one of the outermost layers of this multilayer board and a motherboard (not shown) is connected to the outermost layer on the opposite side, the reliability of the connection between integrated circuit elements 109 and the multilayer board is poor. The reason for this poor reliability is the high degree of thermal stress that occurs between integrated circuit elements 109 and the multilayer board due to the great difference between the linear expansion coefficient of the built-up portion of the multilayer board (approximately 50 ppm in the direction of thickness and 14-16 ppm in the surface direction) and the linear expansion coefficient of the silicon that is the main material of integrated circuit elements 109 (3-4 ppm in the direction of thickness and 3-4 ppm in the surface direction).

On the other hand, a ceramic multilayer board such as was disclosed in Japanese Patent Application Laid-Open No. 2002-118194 does not allow green sheets of very thin construction. For example, when constructing a multilayer board having ten or more, or in particular, having thirteen or more layers, the thickness of the green sheets, which each have a thickness of, for example, 2 mm or more, complicates their use as a package for semiconductor devices.

In this example, conductive pattern 106 is formed by printing metal on a green sheet, following which the green sheet is sintered and cured. However, the final dimensional accuracy of conductive pattern 106 is poor in this fabrication method, and adequate control of the position of conductive pattern 106 to obtain the desired impedance is therefore extremely difficult.

In addition, when flip-chip integrated circuit elements 109 are mounted on one outermost layer of this multilayer board and a motherboard (not shown) is connected to the outermost layer on the opposite side, the reliability of the package connections are poor. This poor reliability results from the great difference between the linear expansion coefficient of the ceramic that is the main material of the multilayer board (4-6 ppm in the direction of thickness and 4-6 ppm in the surface direction) and the linear expansion coefficient of the glass epoxy resin that is the main material of the motherboard (16-17 ppm in the direction of thickness and 60 ppm in the surface direction). In addition, the semiconductor device package is subject to a high degree of stress. Further, the dielectric constant of a ceramic is higher than that of an organic material, and the loss of the high-frequency signal that passes through the conductive pattern is therefore great.

Japanese Patent Application Laid-open No. 2004-095963 discloses a multi-layer board comprising a thermoplastic polyimide sheet having a thermosetting characteristic and a glass transition point Tg which is lower than the curing start temperature Ts of a thermosetting component.

Japanese Patent Application Laid-open No. 2004-064009 discloses a method of manufacturing a printed circuit board wherein a plurality of slits are formed so as to surround a product region in each of laminated resin films. Further, Japanese Patent Application Laid-open No. 2003-318538 also discloses a method of manufacturing a printed circuit board wherein a plurality of slits are formed between product regions in each of laminated resin films.

Japanese Patent Application Laid-open No. 2003-324280 discloses a method of manufacturing a printed circuit board comprising thermoplastic resin sheets having a conductive pattern on one surface and a via hole on the other surface. Many thermoplastic resin sheets are laminated and simultaneously bonded each other and the conductive pattern is connected to the low melting point metal filled in the via hole by metallic bonding.

Japanese Patent Application Laid-open No. 2003-209356 discloses a method of manufacturing a multi-layer board wherein a plurality of through holes are formed in each of resin films so as to superpose each other in a laminating direction of the films and conductive paste is filled in the through holes. The conductive paste is sintered to form poles which support a hot pressing plate, when the laminated films are heated and pressurized.

Japanese Patent Application Laid-open No. 2003-273511 discloses a pressing method wherein a plurality of thermoplastic films having a conductive pattern on one surface are laminated and simultaneously bonded each other by heating and pressurization on the both sides with buffer members each of which is interposed between the outermost thermoplastic film and a thermal pressing plate.

"Microelectronics Packaging Handbook" by Rao R. Tummala, Eugene J. Rymaszewski, and Alan G. Klopfenstein, in particular pp. 375-411 of Japanese version, teaches various type of package, such as a ceramic chip carrier, a flat package, a hybrid package and a multi-layer ceramic substrate.

SUMMARY OF THE INVENTION

It is an object of the present invention to provide a package substrate for a semiconductor device that is easy to fabricate, that, compared to the prior art, facilitates a multiple layer configuration, and that has higher reliability of electrical connections, to provide a fabrication method of such a semiconductor device package substrate, and to provide a semiconductor device that includes this semiconductor device package substrate.

According to the present invention, in a package substrate for a semiconductor device that is formed by stacking and bonding together a plurality of layers of a thermoplastic resin having conductive vias that pass through the layers in the direction of thickness and that incorporates conductive patterns that are composed of metal layers provided on at least one surface of the thermoplastic resin layers, connection terminals are exposed on one outermost layer for mounting and electrically connecting an integrated circuit element of the flip-chip connection type, and conductive ball terminals that make up a ball grid array construction are exposed on the outermost layer of the opposite side.

According to this configuration, many more layers can be stacked (for example, 1.5 times more layers) in substantially the same thickness than in a package substrate of the prior art. Accordingly, electrical wiring can be formed using a multiplicity of layers, whereby wiring can be facilitated without excessive routing of signal-wiring patterns within the same plane. The degree of freedom of wiring design is thus greatly enhanced, and wiring design is greatly facilitated. For example, different types of conductive patterns (such as signal-wiring patterns, power-supply patterns, and ground patterns) can each be formed on a different layer provided for each type.

In particular, the effect of allowing a greater multiplicity of thin layers than in the prior art is particularly pronounced in configurations having 16 or more thermoplastic resin layers, in which the thickness in the stacked and bonded state is 0.8 mm-2.0 mm, in which one or more vias are provided in each of all thermoplastic resin layers or in all thermoplastic resin layers other than the outermost layers, and in which 17 or more layers of conductive patterns are provided.

The reliability of mechanical connections and electrical connections is particularly great when the conductive patterns and the vias that contact these conductive patterns are connected by intermetallic compound bonding.

A plurality of connection terminals for flip-chip connection with an integrated circuit element is preferably exposed on one outermost layer, thermoplastic resin being interposed between each of the connection terminals, covering at least a portion of the side surfaces of the connection terminals and preventing short circuits between the connection terminals. A plurality of metal pads on which respective ball terminals are arranged is also preferably exposed on the outermost layer of the opposite side, thermoplastic resin being interposed between each of the metal pads, covering at least a portion of the side surfaces of the metal pads and preventing short circuits between the metal pads. When the pitch of the connection terminals and/or the metal pads is on the micro level for achieving higher density, using masking and coating to interpose a material such as solder resist between connection terminals and/or between metal pads is particularly problematic, but the above-described configuration greatly facilitates the interposition of thermoplastic resin between connection terminals and/or between metal pads, and this thermoplastic resin serves as a barrier that prevents the dispersion of solder at the side surfaces of the connection terminals and/or metal pads or the inflow of solder to the interface with the lower-layer material.

The connection terminals that are exposed on one of the outermost layers preferably contact with vias that are provided directly below these terminals and electrically connect to the conductive patterns by way of these vias. A plurality of metal pads on which are arranged respective ball terminals is also preferably exposed on the outermost layer on the opposite side, these metal pads contacting vias that are provided directly below these metal pads and electrically connecting with the conductive pattern by way of the vias. When this type of pad-on-via configuration is adopted, connection is realized by the shortest distance, whereby the electrical loss or delay is minimized. This configuration is more effective when at least three layers of conductive patterns are electrically connected by at least two vias that are positioned in alignment in a column in the direction of thickness at the same planar position of at least two thermoplastic resin layers. Further, electrical loss and delay can be minimized and an extremely effective configuration can be realized when a configuration is adopted in which all thermoplastic resin layers, or all thermoplastic resin layers other than the outermost layers, have vias that are provided at the same planar position and make up an electrically connected structure in which these vias are arranged in alignment in a column in the direction of thickness across all of the thermoplastic resin layers.

The linear expansion coefficient in the direction of thickness of each thermoplastic resin layer is preferably 140 ppm or less; and the linear expansion coefficient in the direction that is parallel to the surface is preferably 40 ppm or less. In addition, the product of the linear expansion coefficient and modulus of elasticity of each thermoplastic resin layer is preferably 0.6 MPa/° C. or less in the direction of thickness, and preferably 0.18 MPa/° C. or less in the direction that is parallel to the surface. Such a configuration can suppress package damage or deformation that is caused by the thermal stress that arises from the differences in linear expansion coefficients between each of integrated circuit elements, the package substrate, and an external board.

The thermoplastic resin layers may be any one of, or a mixture containing at least one of: polyetheretherketone, polyetherimide, liquid crystal polymer, polyphenylene sulfide, thermoplastic polyimide, polyethersulfone, polyphenylene ether, and syndiotactic polystyrene. Due to the use of these types of thermoplastic resins, the thermoplastic resin can absorb the thermal stress that is produced at high temperatures by the differences between the linear expansion coefficients of the integrated circuit element, the package substrate, and an external board. In addition, thermoplastic resins have a low dielectric constant and low dielectric loss and can therefore be used to form transmission paths having excellent high-frequency characteristics. In contrast to ceramic layers or layers of an organic material such as epoxy resin of the prior art, a thermoplastic resin can form paths having low dielectric loss even at high frequencies.

The conductive patterns may include a micro signal-wiring pattern and planar patterns that are formed with a greater area than the signal-wiring pattern. A portion of a signal-wiring pattern may have a planar overlap with a planar pattern that is positioned in a upper layer than the signal-wiring pattern and a planar pattern that is positioned at a lower layer, and may be in a position that is interposed between the two planar patterns. One or both of the two planar patterns that have a planar overlap with the signal-wiring pattern may be formed on a surface that is separated by at least the thickness of two layers of the thermoplastic resin in the direction of thickness from the surface of the thermoplastic resin on which the signal-wiring pattern is formed. At least one surface that is an intermediate layer may exist between the surface on which the signal-wiring pattern is formed and the surface on which the planar pattern is formed and that is separated by at least the thickness of two layers of thermoplastic resin. A conductive pattern may not be formed in an area, that is interposed between the signal-wiring pattern and the planar pattern, of the surface that is the intermediate layer. A planar pattern may be formed outside this area. A planar pattern that is not directly connected to the signal-wiring pattern may be formed outside the signal-wiring pattern on the surface on which the signal-wiring pattern is formed.

According to this configuration, space can be effectively used to form various conductive patterns while achieving desired electrical characteristics of the signal-wiring patterns by means of the so-called offset line configuration. In other words, the ability to use a multiplicity of layers allows an increase in the number of planar patterns such as power-supply patterns and ground patterns.

Of the pair of planar patterns that have a planar overlap with a portion of the signal-wiring pattern, the planar pattern that is formed on a surface that is the intermediate layer, and the planar pattern that is formed outside the signal-wiring pattern, at least one may be a power-supply pattern and the other planar patterns are ground patterns. When at least one power-supply pattern and at least one ground pattern confront each other and form a capacitor, the characteristic of the power-supply pattern can be stabilized, and the impedance between the power-supply pattern and the ground pattern can be reduced.

A ground pattern, a power-supply pattern, or a dummy pattern made of metal that is isolated and makes no contribution to electrical connections is preferably formed on the surface of at least one thermoplastic resin layer for correcting imbalance in the distribution of metal in the surface. In addition, a ground pattern, a power-supply pattern, or a dummy pattern made of metal that is isolated and that makes no contribution to electrical connections is preferably formed on the surface of at least one thermoplastic resin layer for correcting variations, for each of the surfaces, in the proportion of the area of the metal over the entire surfaces of the thermoplastic resin layer. A ground pattern, a power-supply pattern, or a dummy pattern made of metal that is isolated and that makes no contribution to electrical connections is also preferably formed on the surface of at least one thermoplastic resin layer for correcting variations in the proportion of the area of metal in any planar region in each surfaces of the thermoplastic resin layers. In particular, a ground pattern, a power-supply pattern, or a dummy pattern made of metal is preferably formed at least in the vicinity of vias. Making the distribution of metal uniform in this way prevents major deformation in portions having a low proportion of metal, prevents distortion of the overall shape and degradation of dimensional accuracy, and prevents the occurrence of problems in the electrical connections, particularly when heat or pressure is applied.

A plurality of venting holes is preferably provided in planar conductive patterns that are provided in the vicinity of vias of the thermoplastic resin layer, these venting holes being arranged symmetrically with vias as centers. Further, a plurality of venting holes is preferably provided in planar conductive patterns that are provided in portions outside the vicinities of vias, these venting holes being arranged in matrix form. The provision of these venting holes allows the release of gas that occurs within the substrate, such as the gas that occurs upon vaporization of solvents that are mixed with the metal paste that is the material of vias. In addition, the vicinity of a via may be the area within a circle having a radius of 300 µm with the via as center.

Vias that connect to connection terminals that are exposed on one outermost layer are preferably arranged so as to contact positions of the connection terminals that are toward the center of the thermoplastic resin layer. Vias, that are connected to the metal pads on which ball terminals are placed that are exposed on the outermost layer of the opposite side, are also preferably arranged to contact positions of the metal pads that are toward the center of the thermoplastic resin layer. This configuration can prevent unreliable electrical connections that are caused when vias tilt within the thermoplastic resin layer, and further, can suppress deformation of the overall board.

The semiconductor device of the present invention includes: a package substrate for a semiconductor device having any of the above-described configurations; an integrated circuit element of the flip-chip connection type that is mounted on one outermost layer and that is electrically connected to connection terminals; and an external board that is attached to the outermost layer of the opposite side and that is electrically connected to ball terminals.

The method of fabricating a package substrate for a semiconductor device according to the present invention is a method in which a plurality of thermoplastic resin layers are formed, conductive vias are formed in all thermoplastic resin layers or in all thermoplastic resin layers other than the outermost layers such as these vias pass through the thermoplastic resin layers in the direction of the thickness, metal layers that make up conductive patterns are provided on at least one surface of the thermoplastic resin layers, following which the plurality of thermoplastic resin layers are stacked and heat and pressure are applied to the collection of thermoplastic resin layers to bond the thermoplastic resin layers together as a single unit. This method is characterized by the provision of connection terminals for mounting and electrically connecting an integrated circuit element of the flip-chip connection type such that the connection terminals are exposed to the outside from the thermoplastic resin layer that is positioned on one outermost layer; and the provision of conductive ball terminals that make up a ball grid array structure such that the conductive ball terminals are exposed to the outside from the thermoplastic resin layer that is positioned on the outermost layer of the opposite side.

The present invention simultaneously enables both thinner form and an increased number of layers in a package substrate that includes a ball grid array structure and flip-chip connection terminals, such a construction being beyond the capability of the prior art. In addition, the use of a thermoplastic resin can raise the reliability of the electrical connections while preventing deformation of the substrate.

The above and other objects, features, and advantages of the present invention will become apparent from the following description with reference to the accompanying drawings, which illustrate examples of the present invention.

BRIEF DESCRIPTION OF THE DRAWINGS

FIG. 24A is a sectional view showing the relation of the relative positions of vias and connection terminals of the package substrate of the present invention; and FIG. 24B is an enlarged view of the principal elements of FIG. 24A.

DETAILED DESCRIPTION OF THE PREFERRED EMBODIMENTS

Figure 7:
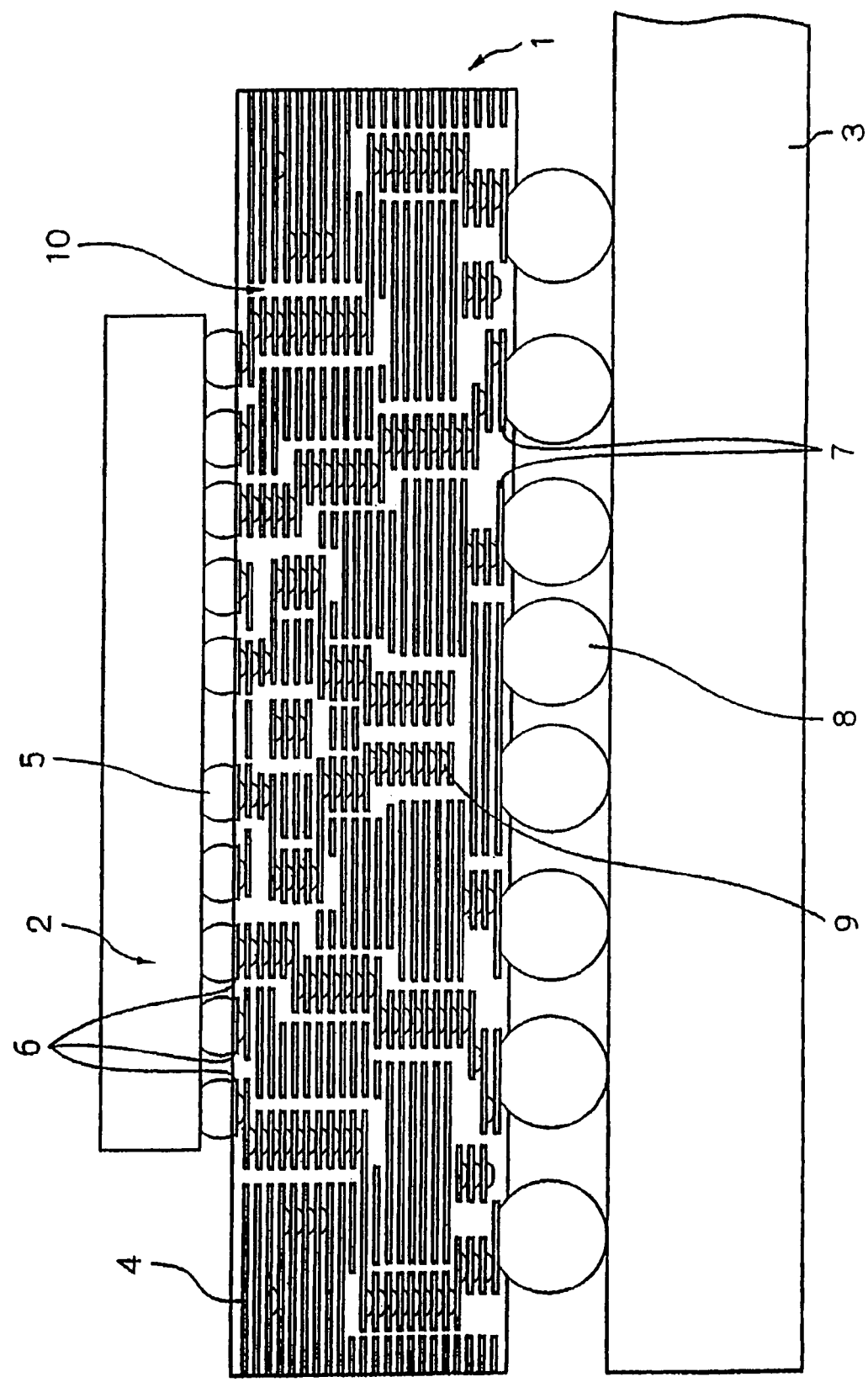
FIG. 7 is a sectional view showing the overall semiconductor device of the present invention.
Figure 8:
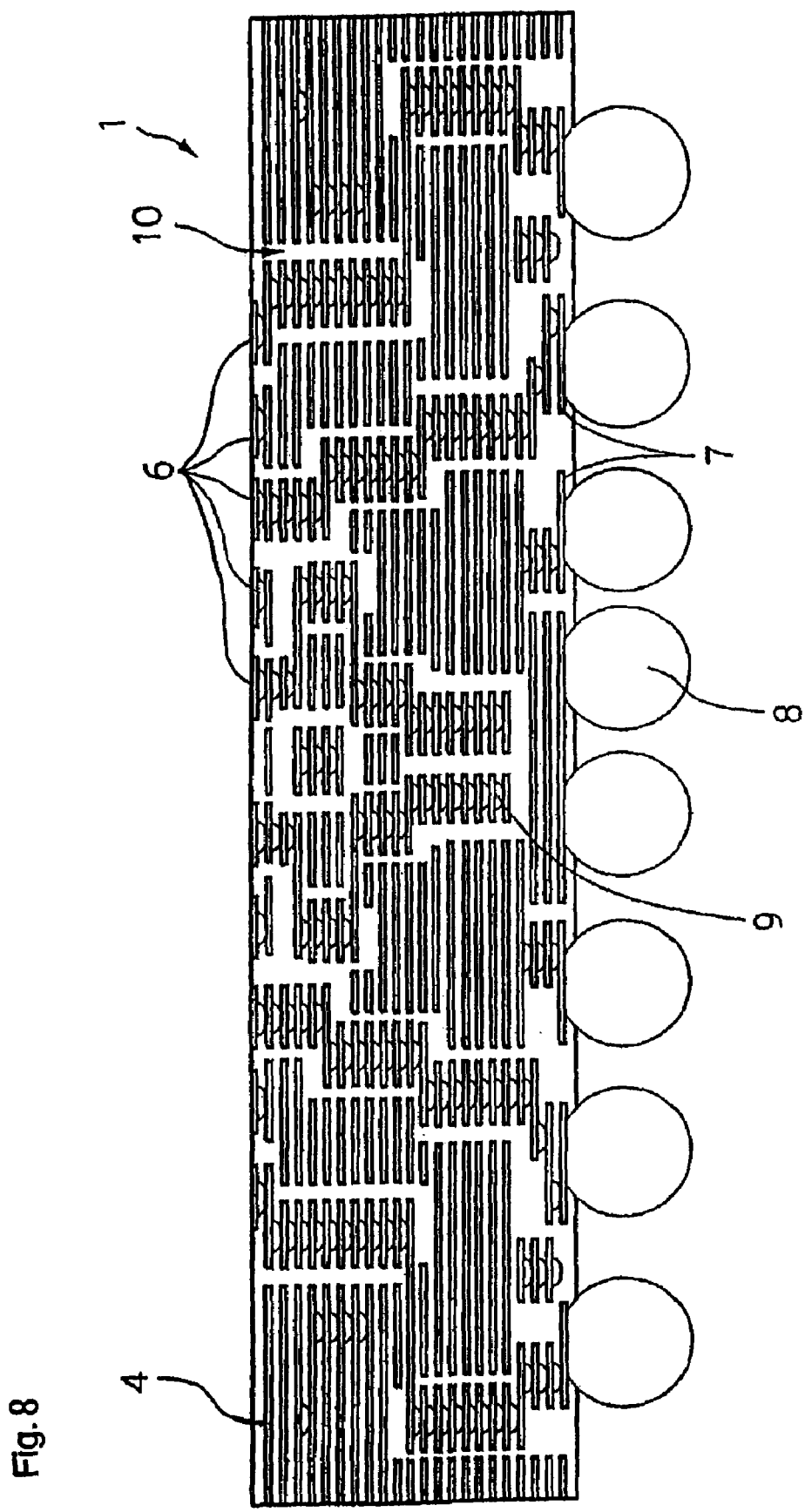
FIG. 8 is a sectional view showing the package substrate of the semiconductor device shown in FIG. 7.

FIG. 7 shows the semiconductor device of the present invention, and FIG. 8 shows a package substrate (multilayer board) 1 for this semiconductor device. The following explanation first regards the basic configuration of this semiconductor device. In this semiconductor device, an integrated circuit element of the flip-chip connection type such as LSI chip 2 is mounted on one outermost layer of multilayer board 1. A motherboard 3, which is an external board, is connected on the outermost layer of the opposite side of multilayer board 1. Multilayer board 1 is a super-multilayer board having 23 layers of conductive patterns 4. A plurality of connection terminals 6 for securing connection bumps 5 of LSI chip 2 is exposed to the outside on one outermost layer. A multiplicity of metal pads 7 is provided on the outermost layer of the opposite side and ball terminal (solder ball) 8 is secured on each metal pad 7 to form a ball grid array (BGA) construction for connecting with motherboard 3.

Figure 9:
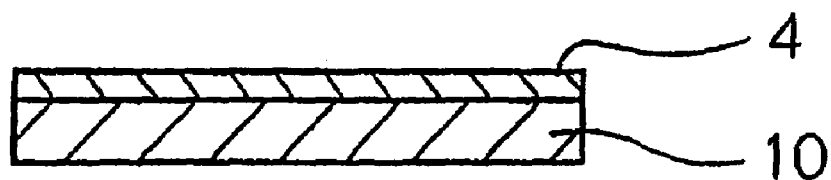
FIGS. 9A-9D are explanatory views showing the steps of fabrication of a thermoplastic resin layer of the package substrate of the present invention.
Figure 9:
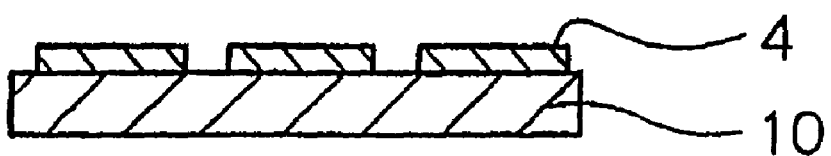
Figure 9:
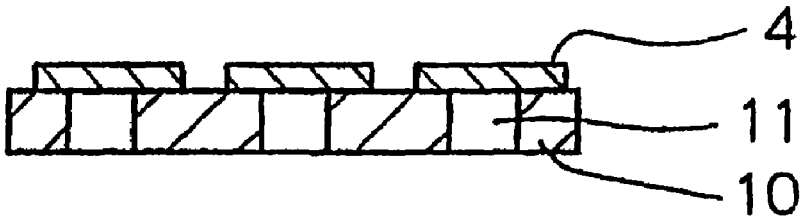
Figure 9:
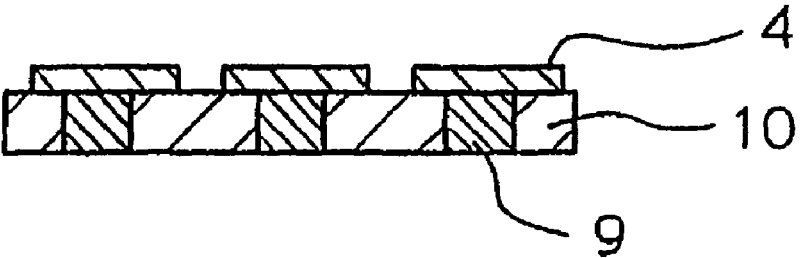
Figure 10A:
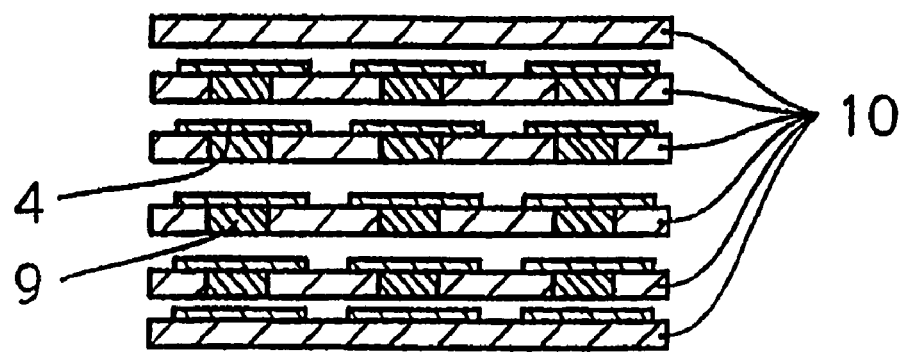
FIGS. 10A-10C are explanatory views showing steps for fabricating a package substrate from thermoplastic resin layers that are shown in FIGS. 9A-9D.
Figure 10B:
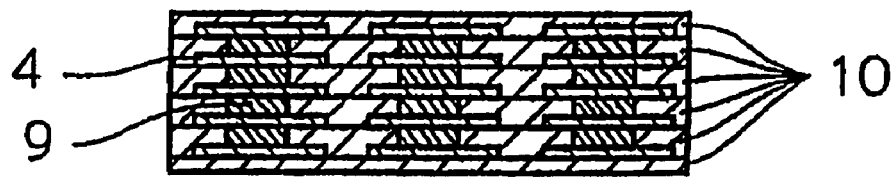
Figure 10C:
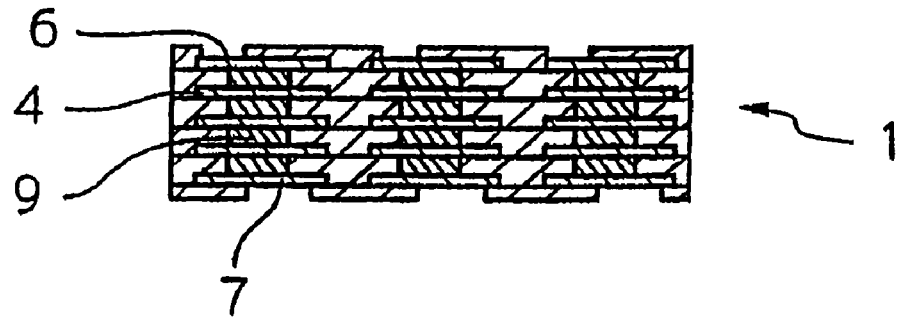

The basic configuration and fabrication method of the inner-layer portion of this multilayer board 1 is essentially the same as the configuration disclosed in Japanese Patent Application Laid-Open No. 2000-38464. To explain this point, as shown in FIG. 9D, a plurality of (23 in the examples shown in FIGS. 7 and 8) thermoplastic resin layers (film insulators) 10 are prepared, each thermoplastic resin layer 10 having conductive pattern 4 that is composed of metal foil (for example, copper foil) formed in a desired shape on at least one surface and conductive vias 9 that pass through in the direction of thickness. More specifically, as shown in FIG. 9A, copper foil is adhered to the surface of film insulator 10 that has been formed in advance. As shown in FIG. 9B, this copper foil is next patterned by etching to a desired shape to form conductive pattern 4 such as a signal-wiring pattern or planar pattern (ground pattern or power-supply pattern) that will be explained hereinbelow. Through-holes 11 are next opened at prescribed positions of film insulator 10 by laser irradiation, as shown in FIG. 9C. Then, as shown in FIG. 9D, a metal paste in which metal powder has been mixed with solvent is buried in through-holes 11 to form vias 9. A plurality of film insulators 10 that have been formed in this way is aligned together and stacked as shown in FIG. 10A. As shown in FIG. 10B, the stack is heated while being pressed together to thermally fuse each of the film insulators 10 together and thus form a single unit. In the examples shown in FIGS. 7 and 8, a configuration is adopted in which 23 film insulators 10 have been stacked together, but in the interest of simplifying the figure, a configuration is shown in FIGS. 10A-10C in which six film insulators 10 have been stacked together.

Film insulators 10 are composed of a compound of approximately 65-35 weight % of polyarylketone resin and approximately 35-65 weight % of polyetherimide resin. Film insulators 10 are preferably a material in which the glass transition temperature measured by differential scanning calorimetry during rising temperature is 150-230° C., in which the crystalline melting point peak temperature is 260° C. or greater, and in which the crystalline melting heat ΔHm and the heat of crystallization ΔHc that is generated by crystallization during rising temperature satisfy the relation [(ΔHm−ΔHc)/ΔHm]≦0.35. Polyarylketone resin is a thermoplastic resin that includes aromatic nucleus linkage, ether linkage, and ketone linkage among its structural units, representative examples including polyetherketone, polyetheretherketone, and polyetherketoneketone. In the present invention, polyetheretherketone is ideally used. Polyetherimide resin, on the other hand, is an amorphous thermoplastic resin that contains aromatic nucleus linkage, ether linkage, and imide linkage among its structural units. In the present invention, an amorphous polyetherimide is ideally used. However, other resins or additives may be combined in the film insulators as appropriate (for example, heat stabilizers, ultraviolet absorbers, light stabilizers, nucleating agents, coloring agents, lubricants, fire retardants, and fillers such as inorganic fillers). In addition, the surface of the film insulators may be treated by an embossing process or corona treatment as appropriate for improved handling.

The method of fabricating film insulators 10 is not subject to any particular limitations, and a known method such as an extrusion casting method or a calender method may be adopted. In particular, an extrusion casting method is preferable from the standpoint of film production and stable production of sheets. The forming temperature in the extrusion casting method is adjusted as appropriate according to film formation or the fluid characteristics of the composition, but is generally above the melting point and equal to or less than 430° C. In addition, the thickness of film insulators 10 is normally 25-300 μm.

Conductive patterns 4 on the surface of film insulators 10 are formed of a metal foil of, for example, copper, gold, silver, aluminum, nickel, or tin having a thickness of 5-70 μm and are patterned to desired shapes. In particular, patterns in which a chemical finishing process such as a black oxide treatment is carried out on the surface of copper foil are ideally used.

The thermal fusion method for unifying the plurality of film insulators 10 is not subject to any particular limitations, and any known method that can apply heat and pressure may be adopted. For example, a heat press method, a heat laminate rolling method, or a combination of these methods may be suitably adopted.

In the present invention, a plurality of connection terminals 6 is exposed to the outside from one outermost layer of multilayer board 1 that has been formed in this way. In addition, a multiplicity of metal pads 7 is exposed to the outside from the outermost layer of the opposite side, and solder balls 8 are secured on each metal pad 7 to form a BGA structure. Both the plurality of connection terminals 6 on one outermost layer and the plurality of metal pads 7 of the outermost layer on the opposite side are formed similar to the previously described conductive patterns 4 of the innerlayer portion.

When film insulators 10 that cover these connection terminals 6 or metal pads 7 are present, connection terminals 6 or metal pads 7 are exposed to the outside by opening holes in film insulators 10 that are positioned on the outside as shown in FIG. 10C. However, a construction is also possible in which there are no film insulators 10 that cover connection terminals 6 (or metal pads 7) as shown in FIGS. 7 and 8, and connection terminals 6 (or metal pads 7) are positioned in the outermost layer with their upper surfaces exposed. Solder balls 8 (see FIGS. 7 and 8) are mounted on each of metal pads 7 and secured by reflow.

The connection pads of motherboard 3 are then each placed in contact with solder balls 8 of this multilayer board 1 and secured by reflow. Bumps 5 for connection of LSI chip 9 are placed in contact with connection terminals 6 and secured by heating. In this way, LSI chip 9 and motherboard 3 are not only mechanically secured and packaged by way of multilayer board 1, but also electrically connected by way of each conductive pattern 4 in multilayer board 1 (refer to FIG. 7). In addition, bumps 5 for flip-chip connection of LSI chip 2 may be secured to connection terminals 6 in advance to realize a BGA construction, or alternatively, bumps 5 may be secured when connecting LSI chip 2.

This multilayer board 1 is not formed by successively forming each substrate layer (organic-material layers composed of, for example, epoxy resin) 102 on core material 101 as with a built-up multilayer board of the prior art, but by collecting and stacking a multiplicity of film insulators 10 and applying heat and pressure collectively to bond film insulators 10 all at once. The fabrication process is thus simplified, the fabrication time is shortened, and the fabrication costs are reduced. In addition, because thick core material 101 is not needed to serve as a base for stacking and forming each substrate layer 102, the overall thickness can be made far thinner than in a built-up multilayer board. In addition, a thinner construction can also be achieved because each layer can be made thinner than in a ceramic multilayer board. In particular, the present invention enables super-multilayer constructions of 16 or more layers (configurations having 17 or more layers of conductive patterns) that were problematic in configurations of the prior art such as were described in Japanese Patent Application Laid-Open No. 2004-158671 and Japanese Patent Application Laid-Open No. 2002-118194 while keeping the thickness of the stacked unit of all film insulators 10 to approximately 0.8 mm-2.0 mm.

Connecting each conductive pattern 4 and vias 9 in contact with these conductive patterns 4 by intermetallic compound bonding enables extremely secure connections, greatly raises the reliability of connections, and is therefore preferable.

The linear expansion coefficient in the direction of thickness of film insulators 10 is preferably limited to 140 ppm or less, and the linear expansion coefficient in the direction that is parallel to the surface is preferably limited to 40 ppm or less. This point is explained in more detail below.

Figure 11A:
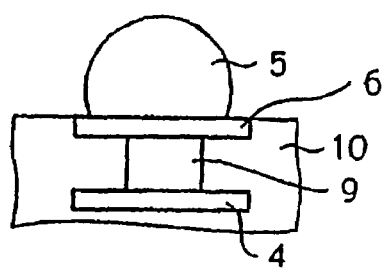
FIG. 11A is an enlarged sectional view showing the vicinity of one outermost layer of the package substrate shown in FIG. 8.

Taking one outermost layer as an example for this explanation, vias 9 are positioned directly below connection terminals 6 as shown in FIG. 11A in the present embodiment to thus minimize the connection distance, reduce electrical loss, and improve space utilization. This construction is called a "pad-on-via" construction. When vias 9 are thus arranged directly below connection terminals 6, the thermal stress that occurs in vias 9 must not exceed the strength of the material that makes up vias 9. If the stress exceeds the strength of the material, the thermal stress during reflow or the thermal stress that arises in the environment of use will damage vias 9 and damage the electrical connections.

Figure 11B:
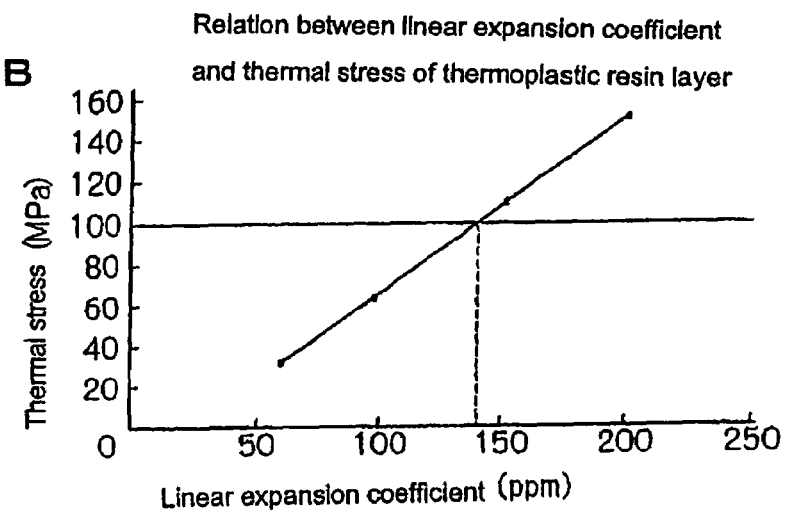
FIG. 11B is a graph showing the relationship between thermal stress and linear expansion coefficient in the direction of thickness of a thermoplastic resin layer.

FIG. 11B shows the results of calculating the relation between the linear expansion coefficient in the direction of thickness (Z-axis direction) of film insulators 10 and the thermal stress that is applied to vias 9 when the linear expansion coefficient of vias 9 is assumed to be 23 ppm (the highest level of linear expansion coefficient when tin or aluminum is used as the typical via material) and the modulus of elasticity of film insulators 10 is assumed to be 5000 MPa (the lowest level of the modulus of elasticity with a resin material). The tensile strength of the material (metal) of vias 9 is on the order of 100-200 MPa, and therefore the maximum thermal stress that these vias 9 can reliably withstand is considered to be on the order of 100 MPa. In addition, because the typical temperature of use is from 125° C. to 45° C., the maximum temperature difference at which the maximum thermal stress occurs is considered to be 170° C. Referring to the graph of FIG. 11B, the linear expansion coefficient in the direction of thickness of film insulators 10 for thermal stress of 100 MPa is approximately 140 ppm. The above calculation is carried out assuming the maximum level of linear expansion coefficient of vias 9 (23 ppm), the minimum level of the modulus of elasticity of film insulators 10 (5000 MPa), and the minimum level of tensile strength of vias 9 (100 MPa). Taking these points into consideration, if the linear expansion coefficient in the direction of thickness of film insulators 10 is 140 ppm or less, damage to vias 9 caused by thermal stress can be almost entirely prevented. However, when contemplating a greater level of safety, the linear expansion coefficient in the direction of thickness of film insulators 10 is more preferably set to 100 ppm or less.

Figure 11C:
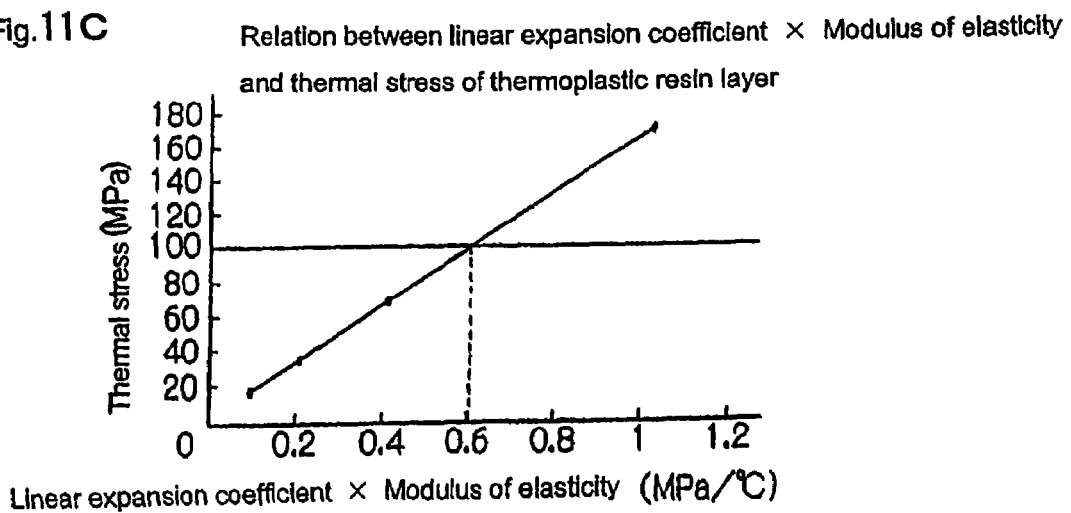
FIG. 11C is a graph showing the relationship between thermal stress and the product of the modulus of elasticity and the linear expansion coefficient in the direction of thickness of the thermoplastic resin layer.

As shown in FIG. 11C, thermal stress is proportional to the product of the modulus of elasticity and the linear expansion coefficient, and is represented as the product of the modulus of elasticity, the linear expansion coefficient, and the temperature difference. Accordingly, in order to suppress the thermal stress that is applied to vias 9 from film insulators 10 to 100 MPa or less, when the maximum temperature difference is 170° C. as described above, the product of the modulus of elasticity and the linear expansion coefficient in the direction of thickness of film insulators 10 should be set to 0.6 MPa/° C. or less, as can be clearly understood from FIG. 11C.

The following explanation regards the linear expansion coefficient in the direction that is parallel to the surface (the direction of the X-axis and Y-axis) of film insulators 10.

Figure 12A:
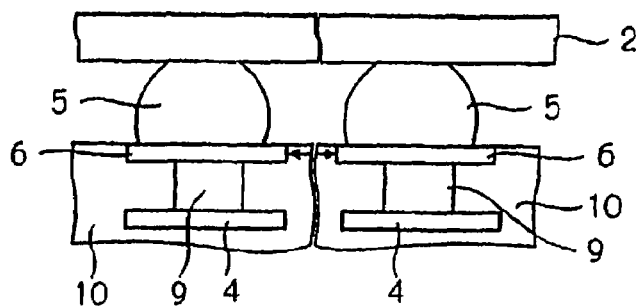
FIG. 12A is an enlarged sectional view showing the vicinity of one outermost layer of the package substrate shown in FIG. 8.

If explanation is presented by taking one of the outermost layers as an example as in the previous explanation, in the present embodiment, connection bumps 5 of LSI chip 2 are secured above connection terminals 6 as shown in FIG. 12A. Thus, expansion of film insulator 10 in the direction parallel to the surface is restrained by LSI chip 2, whereby tensile stress is generated in film insulator 10 due to the difference between the linear expansion coefficients of the thermoplastic resin that makes up film insulator 10 and the silicon that makes up LSI chip 2, giving rise to cracks. To prevent these cracks, the linear expansion coefficient of film insulator 10 must be suppressed.

Figure 12B:
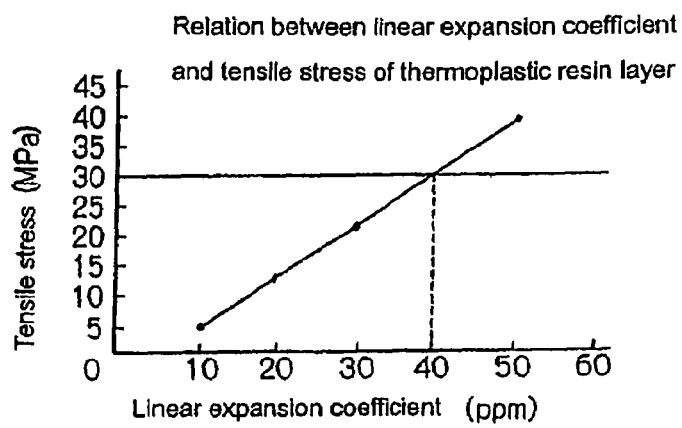
FIG. 12B is a graph showing the relationship between tensile stress and the linear expansion coefficient in the direction parallel to the surface of a thermoplastic resin layer.

FIG. 12B shows the results of calculating the relation between the linear expansion coefficient in the direction parallel to the surface of film insulator 10 (the direction of the X-axis and Y-axis) and the tensile stress that is applied to the film insulator due to the difference between the linear expansion coefficients of film insulator 10 and LSI chip 2 when the modulus of elasticity of film insulator 10 is at the minimum level (5000 MPa).

The maximum tensile stress that film insulator 10 can withstand is on the order of 30 MPa, and because the typical temperature of use is from 125° C. to −45° C., the maximum temperature difference that generates the maximum thermal stress is considered to be 170° C. Referring to the graph of FIG. 12B, the linear expansion coefficient in the direction that is parallel to the surface of film insulator 10 that corresponds to a tensile stress of 30 MPa is approximately 40 ppm. The above-described calculation is carried out on the assumption that the modulus of elasticity of film insulator 10 is at the minimum level (5000 MPa) and the tensile strength of film insulator 10 is at the minimum level (30 MPa). Considering these factors, cracks in film insulator 10 that are caused by the tensile stress arising from the difference in linear expansion coefficient with LSI chip 2 can be almost entirely prevented when the linear expansion coefficient in the direction parallel to the surface of film insulator 10 is 40 ppm or less.

Figure 12C:
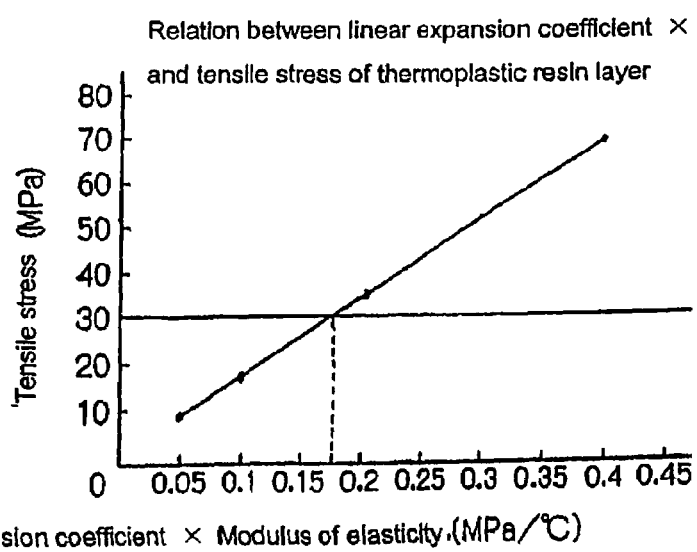
FIG. 12C is a graph showing the relation between tensile stress and the product of the modulus of elasticity and the linear expansion coefficient in the direction parallel to the surface of a thermoplastic resin layer.

When considering fluctuations of the modulus of elasticity in the direction parallel to the surface of this film insulator 10 in order to suppress the tensile stress of film insulator 10 to 30 MPa or less while the maximum temperature difference is 170° C., the product of the modulus of elasticity and the linear expansion coefficient in the direction parallel to the surface of film insulator 10 should be made 0.18 MPa/° C. or less, as can be clearly seen from FIG. 12C.

Although one outermost layer was taken as an example in the foregoing explanation, the case for the outermost layer of the opposite side is considered to be essentially equivalent. In other words, in a pad-on-via construction, the linear expansion coefficient in the direction of thickness of the thermoplastic resin that makes up film insulators 10 is preferably 140 ppm or less (more preferably 100 ppm or less) and the linear expansion coefficient in the direction that is parallel to the surface is preferably 40 ppm or less. The product of the modulus of elasticity and the linear expansion coefficient in the direction of thickness of thermoplastic resin that makes up film insulators 10 is preferably 0.6 MPa/° C. or less, and the product of the modulus of elasticity and the linear expansion coefficient in the direction parallel to the surface is preferably 0.18 MPa/° C. or less.

Taken from a different standpoint, setting the linear expansion coefficient of the thermoplastic resin that makes up film insulators 10 to a value between the linear expansion coefficient of silicon, which is the main material of LSI chip 2 (3-4 ppm in the direction of thickness and 3-4 ppm in the planar direction) and the linear expansion coefficient of glass epoxy, which is the main material of motherboard 3 (approximately 60 ppm in the direction of thickness and 16-17 ppm in the planar direction) is preferable because the thermal stress caused by the differences between the linear expansion coefficients of the three materials of LSI chip 2, multilayer board 1, and motherboard 3 can be suppressed to a low level, the relative dimensional error can be suppressed to a low level, and the connection reliability can be improved. In other words, the linear expansion coefficient in the direction of thickness of the thermoplastic resin that makes up film insulators 10 is preferably within the range of 4-60 ppm, and the linear expansion coefficient in the direction parallel to the surface is preferably within the range 4-16 ppm.

Figure 1:
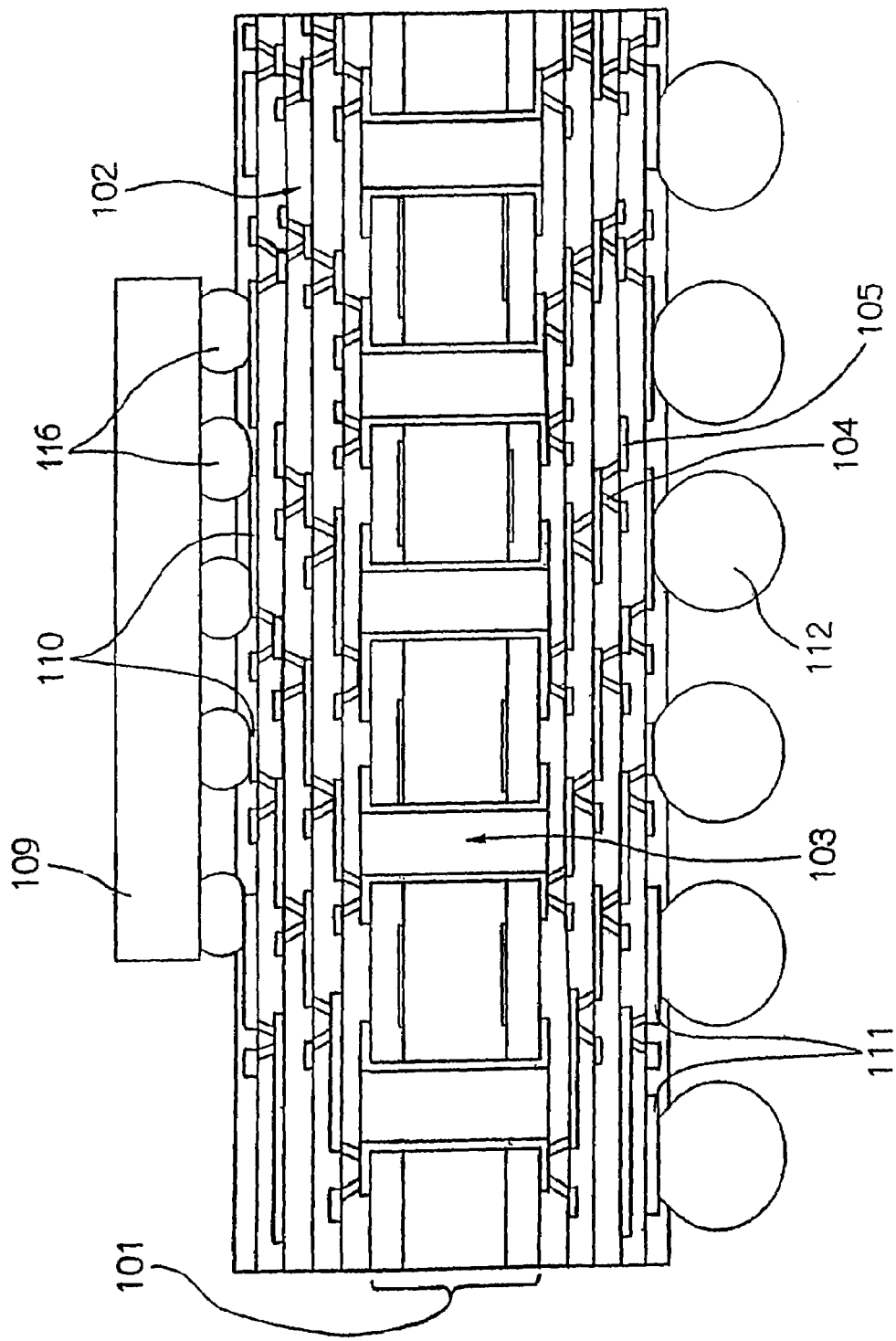
FIG. 1 is a sectional view showing the overall semiconductor device of the first example of the prior art.
Figure 2:
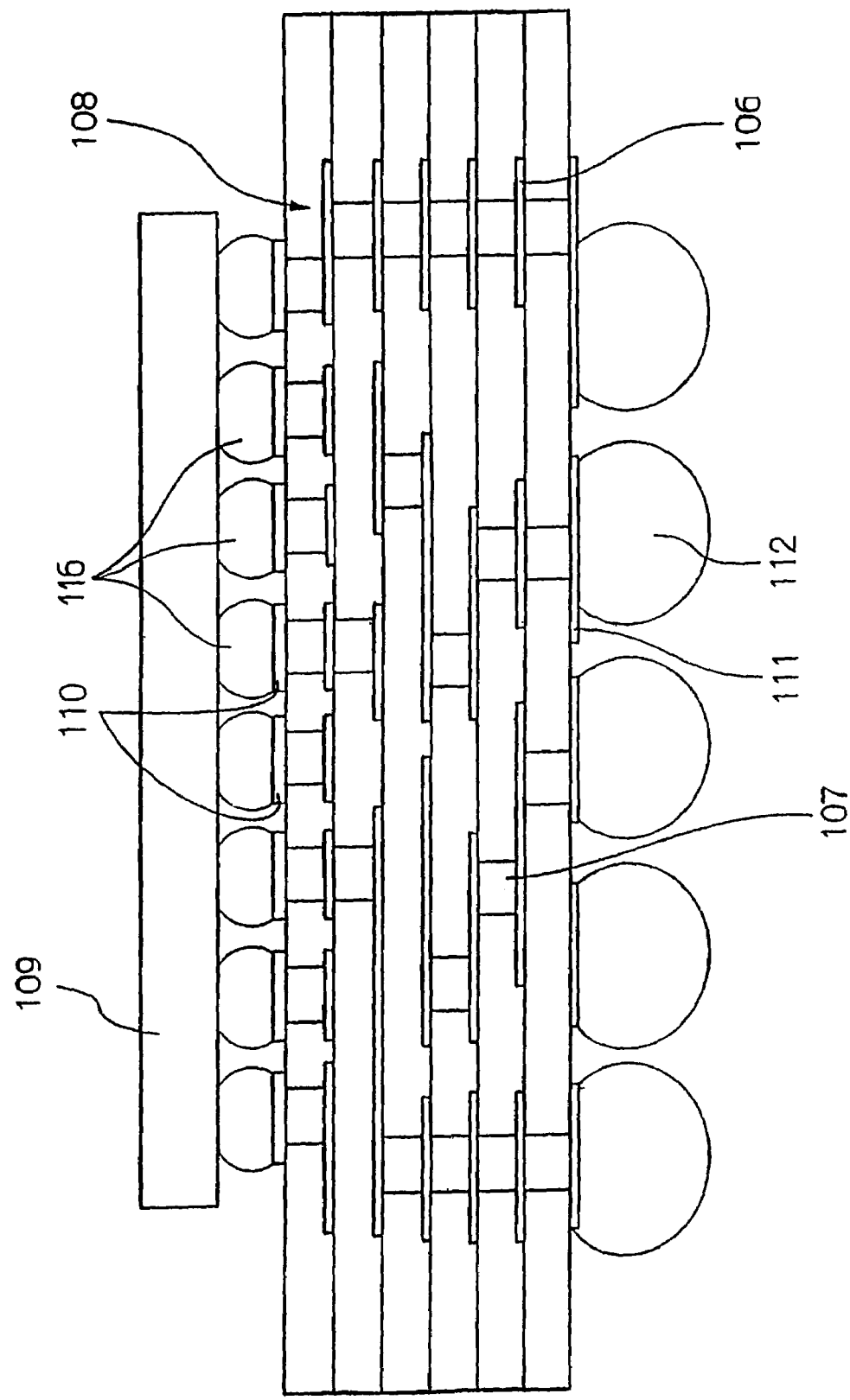
FIG. 2 is a sectional view showing the overall semiconductor device of the second example of the prior art.
Figure 13:
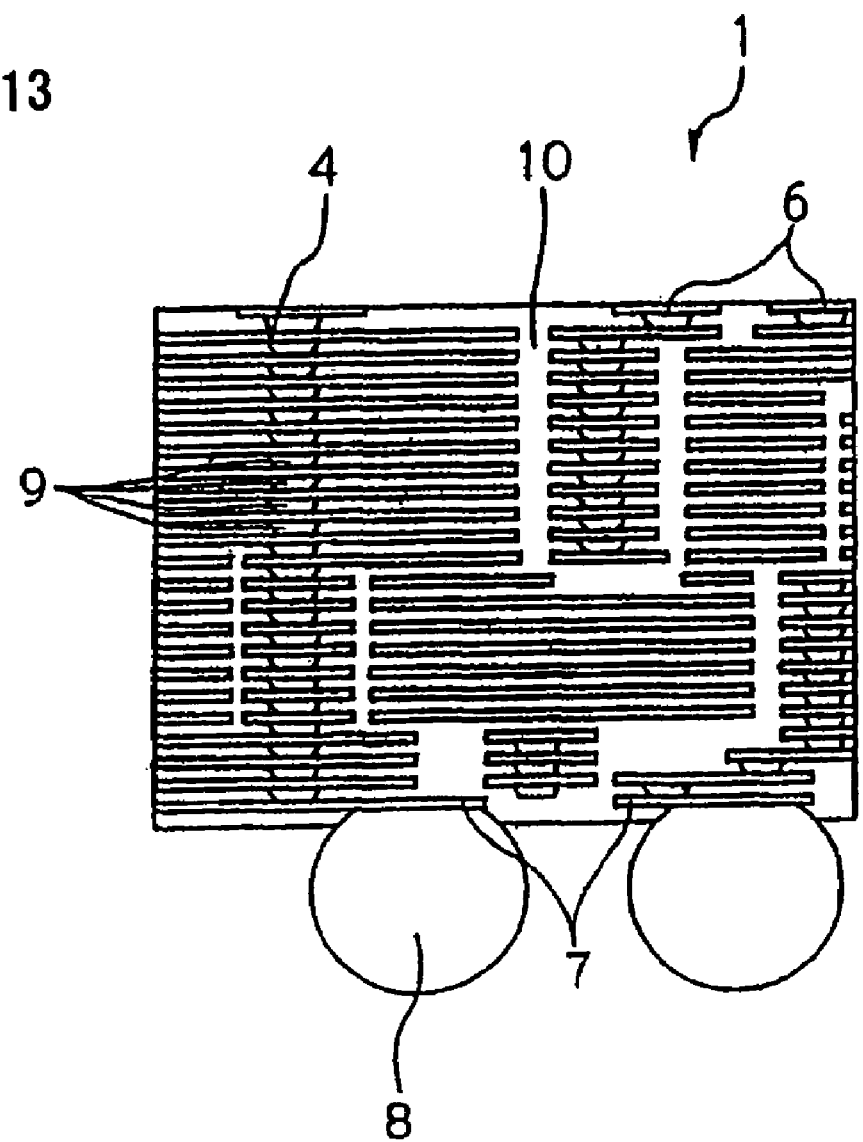
FIG. 13 is a sectional view showing a portion of a variation of the package substrate shown in FIG. 8.

As shown in FIG. 13, by forming vias 9 in the same planar position of each of all film insulators 10 or all film insulators 10 other than the outermost layers such that these vias 9 are aligned in a column in the direction of thickness from one outermost layer to the outermost layer of the opposite side, an electrical connection configuration across all film insulators 10 can be realized using the minimum space. This cannot be achieved in a configuration in which throughholes 103 must be formed instead of vias in thick core material 101, as shown in FIG. 1. However, when each layer is a thin film insulator 10 as in the present embodiment, problems regarding the fabrication steps or the amount of metal that is used do not arise, and easy electrical connections can be realized with excellent space efficiency.

Figure 14:
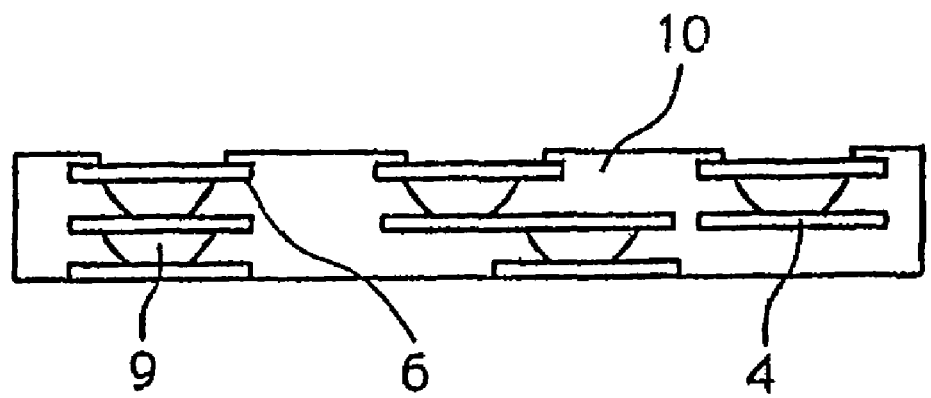
FIG. 14 is an enlarged sectional view showing the vicinity of one outermost layer of a package substrate of the present invention.

FIG. 14 shows an enlargement of the vicinity of connection terminals 6 on one outermost layer of multilayer board 1 of the present invention. As can be clearly understood from FIG. 14, the thermoplastic resin that makes up film insulator 10 is interposed between the plurality of connection terminals 6 for flip-chip connection on one outermost layer and covers at least a portion of the side surfaces of connection terminals 6. This configuration prevents shifting of the positions of connection terminals 6 and contact between the connection terminals 6 that would cause electrical short circuits when, for example, the stack of a multiplicity of film insulators 10 is subjected to pressure, and further prevents solder or metal from entering the gaps between each of connection terminals 6 and causing electrical short circuits between connection terminals 6. The configuration may take a form in which connection terminals 6 are positioned on the outermost layers and the thermoplastic resin covers the side surfaces of connection terminals 6 but is not positioned on the upper surface of connection terminals 6 (does not cover the upper surface) as shown in FIGS. 7, 8, 11A, 12A, 13, 17B, and 18B. Alternatively, the configuration may take a form in which the outermost layers of film insulators 10 are further provided outside the layers on which connection terminals 6 are formed and the thermoplastic resin of these outermost layers is also positioned on a portion of the top surface of connection terminals 6 (covers a portion of the upper surface) as shown in FIGS. 10C, 14, 23A-23B, and 24A-24B. In the latter case, the thermoplastic resin is provided so as to cover a portion of the upper surfaces of connection terminals 6, whereby the reliability for preventing short circuits is further enhanced and connection terminals 6 can be more firmly secured. In this case, moreover, holes are opened in the outermost layers of film insulators 10 to expose a portion of the upper surfaces of connection terminals 6.

Figure 15:
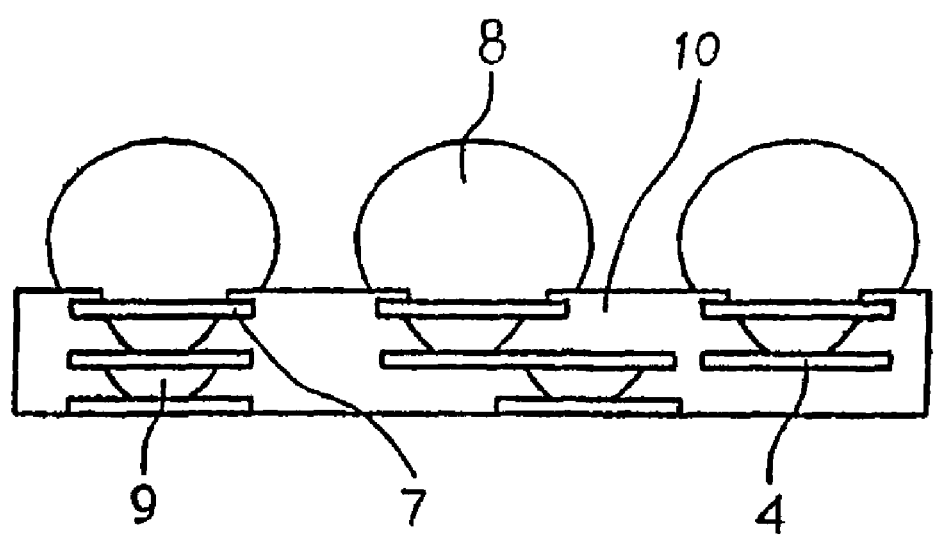
FIG. 15 is an enlarged sectional view showing the vicinity of the outermost layer of the opposite side of the package substrate of the present invention.

FIG. 15 shows an enlargement of the vicinity of metal pads 7 and solder balls 8 in the outermost layer of the opposite side of the multilayer board. As in the configuration shown in FIG. 14, the thermoplastic resin that makes up film insulators 10 is also interposed between these metal pads 7 and covers at least a portion of the side surfaces of metal pads 7. This configuration prevents metal pads 7 from shifting, contacting each other, and causing electrical short circuits, and prevents solder or metal from entering the gaps between metal pads 7 and causing electrical short circuits between metal pads 7. This configuration is particularly effective when using reflow to secure solder balls 8 because it prevents solder from the solder balls from flowing into the spaces between metal pads 7 causing electrical short circuits. In addition, the reliability for preventing short circuits can be further improved if the thermoplastic resin is provided so as to cover a portion of the upper surfaces of metal pads 7. In contrast with the configurations of the prior art, the danger of deformation or damage due to thermal stress can be eliminated without complicating the fabrication process.

Still further, the application of heat when using reflow to secure solder balls 8 causes the thermoplastic resin to soften, and metal pads 7 and solder balls 8 may therefore sink into the softened thermoplastic resin. If the structure hardens in this state, solder balls 8 can be secured very firmly.

Figure 3:
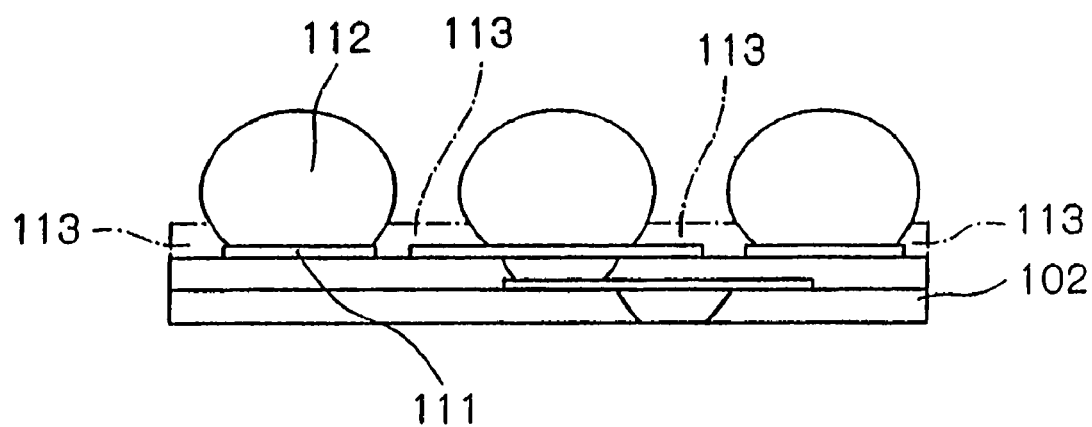
FIG. 3 is an enlarged sectional view showing the vicinity of the outermost layer of a package substrate of the first example of the prior art.

In contrast, in the configuration that is disclosed in, for example, Japanese Patent Application Laid-Open No. 2004-158671, as shown in the enlarged view of FIG. 3, metal pads 111 on which solder balls 112 have been mounted are arranged on thermosetting epoxy resin, and the application of heat during reflow causes the thermosetting epoxy resin to harden. Accordingly, metal pads 111 and solder balls 112 do not sink into substrate layer 102 and are therefore merely mounted on substrate layer 102 in a relatively unstable state. In the configuration that is described in Japanese Patent Application Laid-Open No. 2002-118194 as well, metal pads 111 on which solder balls 112 are mounted are arranged on the already hardened ceramic 108, as shown enlarged in FIG. 4. As a result, metal pads 111 and solder balls 112 do not sink into ceramic 108 and are thus merely mounted on ceramic 108 in a relatively unstable state. The stoving temperatures and other conditions for the sintering of ceramic 108 and the reflow for securing solder balls 112 are entirely different, and the simultaneous sintering of ceramic 108 and securing of solder balls 112 is therefore problematic. Ceramic 108 is not softened by heating during reflow for securing solder balls 112.

According to the present embodiment, metal pads 7 and solder balls 8 can be caused to sink into film insulator 10, which is a thermoplastic resin layer, and thus firmly secured, and this is a feature that could not be achieved in the methods of the prior art such as Japanese Patent Application Laid-Open No. 2004-158671 and Japanese Patent Application Laid-Open No. 2002-118194.

Figure 4:
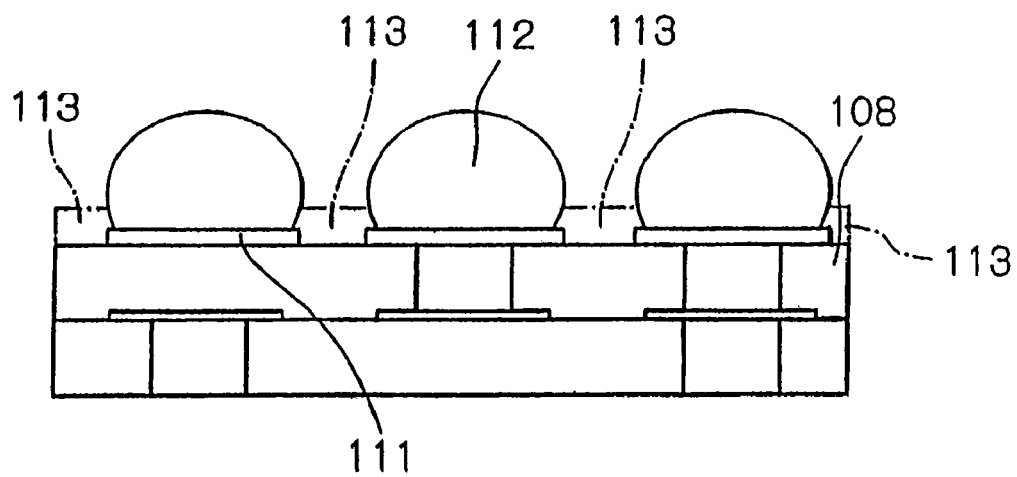
FIG. 4 is an enlarged sectional view showing the vicinity of the outermost layer of the package substrate of the second example of the prior art.

In some configurations of the prior art, preventing short circuits and achieving a stronger securing can be achieved by applying solder resist 113 and covering the side surfaces and a portion of the upper surfaces of metal pads 111 or connection terminals 110 as shown by the alternate long and short dash line in FIGS. 3 and 4. In this case, however, the application of solder resist 113 must be newly added as a separate process, and this addition complicates the fabrication process, lengthens the fabrication time, and raises fabrication costs. In addition, the linear expansion coefficient of solder resist 113 (65 ppm in the direction of thickness and 10-12 ppm in the planar direction) differs greatly from the linear expansion coefficient of the thermosetting substrate layer 102 that serves as the base for fixing metal pads 111 or connection terminals 110 (epoxy resin: 68 ppm in the direction of thickness and 68 ppm in the planar direction) or the linear expansion coefficient of ceramic 108 (4-6 ppm in the direction of thickness and 4-6 ppm in the planar direction), and this difference gives rise to a high level of thermal stress that can cause deformation and damage.

In the present embodiment, however, the base in which metal pads 7 or connection terminals 6 are fixed and the covering portion that covers the side surfaces and a portion of the upper surfaces of metal pads 7 or connection terminals 6 are both composed of the same thermoplastic resin. As a result, film insulators (thermoplastic resin layers) 10 can be collectively formed by the application of heat and pressure, the fabrication process is not complicated, and moreover, because the linear expansion coefficients are the same, there is no potential for the deformation and damage that are caused by thermal stress. Further, even when the high density of the arrangement of connection terminals 6 and metal pads 7 complicates a mask coating, the interposition of thermoplastic resin between each of connection terminals 6 and between each of metal pads 7 according to the present embodiment facilitates the firm securing of these connection terminals 6 and metal pads 7 while preventing electrical short circuits.

In the case of the built-up multilayer board of the prior art that is described in Japanese Patent Application Laid-Open No. 2004-158671, the 20: linear expansion coefficient of the core material (50 ppm in the direction of thickness and 14-16 ppm in the planar direction) differs greatly from the linear expansion coefficient of built-up portion (68 ppm in the direction of thickness and 68 ppm in the planar direction). Changes in temperature therefore cause internal stress within the multilayer board, which may in turn cause deformation and damage.

The material of the film insulators is not limited to that of the previously described examples and can be any one of, or a compound that contains at least one of: polyetheretherketone, polyetherimide, liquid crystal polymer, polyphenylene sulfide, thermoplastic polyimide, polyethersulfone, polyphenylene ether, and syndiotactic polystyrene.

The foregoing explanation regarded the basic configuration of multilayer board 1 and the semiconductor device of the present invention. In the present invention, various design measures are applied to the formation of multilayer board 1 and a semiconductor device, and these measures are entirely novel and were not exercised in the prior art. The following detailed explanations regard the specific content of these measures.

Offset Line Construction

Figure 5:
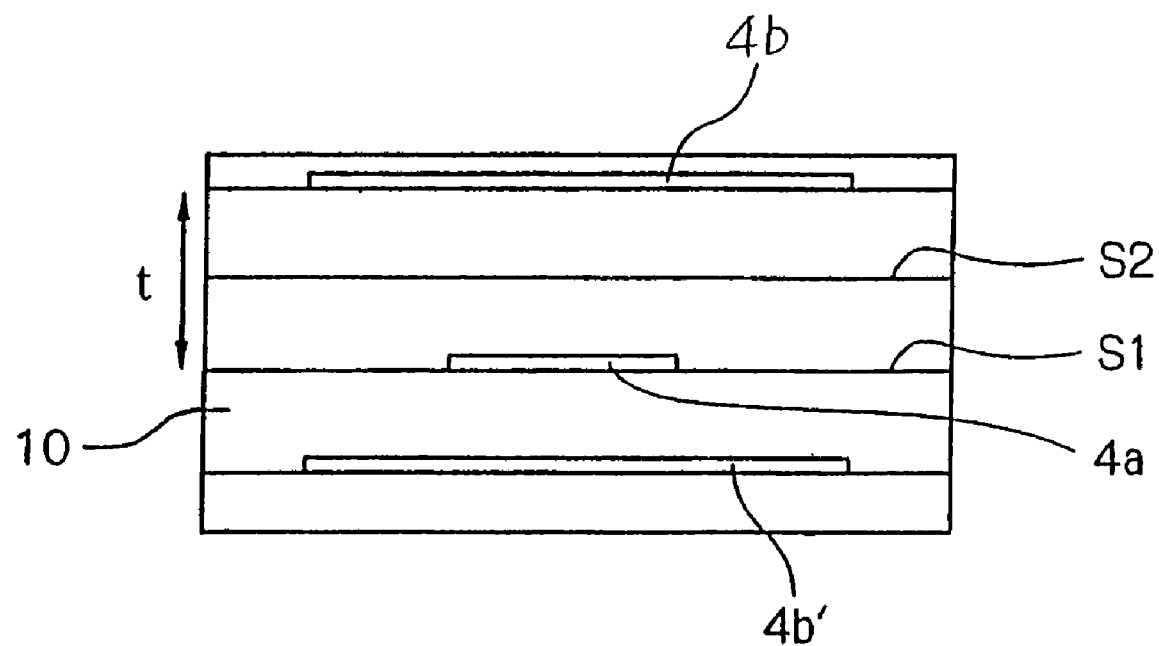
FIG. 5 is an enlarged sectional view showing the offset line construction of the package substrate of the prior art.

The configurations of conductive patterns 4 in multilayer board 1 are determined based on various design rules. Conductive patterns 4 can be broadly classified into four types, namely signal-wiring patterns 4*a*, power-supply patterns, and ground patterns. Signal-wiring patterns 4*a* are forms for routing micro lines. Power-supply patterns and ground patterns typically include a planar pattern 4*b* of relatively large area (an area that is at least larger than signal-wiring pattern 4*a*) in at least one portion. As one design method that has been used from the prior art, there is the so-called offset line construction as shown in FIG. 5 in which a portion of micro signal-wiring pattern 4*a* is formed interposed between and overlapped by a pair of planar patterns 4*b* and 4*b'* on upper and lower planes respectively, that are power-supply patterns or ground patterns, and in which one of the pair of planar patterns 4*b* and 4*b'* (alternatively, although not shown in the figure, by both planar patterns 4*b* and 4*b'*) is formed, not on surface S2 that is adjacent to surface S1 on which signal-wiring pattern 4*a* is formed, but on a further surface at a greater distance than surface S2 from surface S1. At this time, space t that is equal to or greater than twice the thickness of film insulator 10 is provided between signal-wiring pattern 4*a* and the distanced planar pattern 4*b*. This is a design method that is based on freely setting the spacing between signal-wiring pattern 4*a* and planar patterns 4*b* and 4*b'* that overlap the plane signal-wiring pattern 4*a* within a practicable range based on the consideration of such factors as the material of film insulators 10 and the width of signal-wiring pattern 4*a* so as to impart desired electrical characteristics to the flow of electrical signals through signal-wiring pattern 4*a*.

Figure 16:
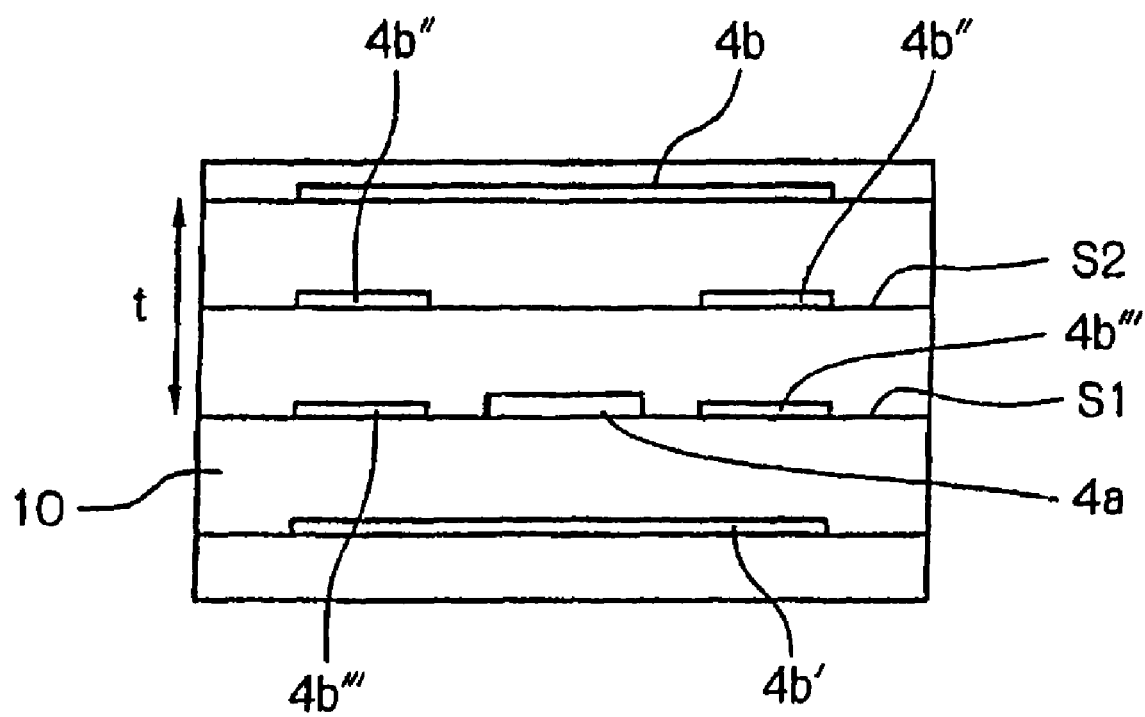
FIG. 16 is an enlarged sectional view showing the offset line construction of the package substrate of the present invention.

In this type of offset line construction, the interior of the portion of increased spacing between signal-wiring pattern 4*a* and planar pattern 4*b* that overlays signal-wiring pattern 4*a* (the portion in which spacing t that is at least the thickness of two layers of film insulators has been provided) is empty space in which nothing is formed to ensure the previously described spacing t, even though surface S2 of film insulator 10 on which conductive pattern 4 can be formed (in this case referred to as "surface that serves as intermediate layer") is located in this space. In the present invention, however, conductive pattern 4*b"* is also formed on surface S2 that serves as an intermediate layer as shown in FIG. 16 in the interest of reducing wasted empty space and improving the space efficiency. In this case, conductive patterns 4 are not formed in the region that is interposed between signal-wiring pattern 4*a* and planar pattern 4*b* so as not to lose the effect of the offset line construction, but planar patterns 4*b"* are formed at a position outside this region that has almost no influence upon the effect of the offset line construction. Still further, planar pattern 4*b'''* is formed on the same surface but outside signal-wiring pattern 4*a* that is interposed between the pair of planar patterns 4*b* and 4*b'* to realize a further improvement of space efficiency. In this case, planar pattern 4*b'''* also has the effect of shielding signal-wiring pattern 4*a*.

Although not shown in the figure, other signal-wiring patterns can be formed on surface S2 that serves as an intermediate layer and/or outside signal-wiring pattern 4*a* in the previously described configuration. In such cases, however, forming offset line constructions or strip line constructions that take into consideration the electrical characteristics of the signal-wiring patterns necessitates an extremely complex pattern structure. In addition, planar pattern 4*b"* that is formed on surface S2 that serves as an intermediate layer and planar pattern 4*b'''* that is formed outside signal-wiring pattern 4*a* may be either power-supply patterns or ground patterns. This increase in the number of layers on which power-supply patterns and/or ground patterns are formed in multilayer board 1 can shorten the routing distance between the power-supply patterns and/or ground patterns and the various conductive patterns that are to be connected to the power-supply patterns and/or ground patterns that are positioned on each layer in multilayer board 1. This shortening of the routing distance has the effect of reducing loss, improving electrical characteristics, and facilitating the design of conductive patterns 4.

As described in the foregoing explanation, any of planar patterns 4*b'''* that are formed outside signal-wiring pattern 4*a*, planar pattern 4*b"* that is formed on surface S2 that serves as an intermediate layer, and the pair of planar patterns 4*b* and 4*b'* that make up the offset line construction may be a power-supply pattern or a ground pattern. However, when any of these planar pattern 4*b*, 4*b'*, 4*b"*, and 4*b'''* (for example, planar pattern 4*b"*) is made a power-supply pattern and the other planar patterns (for example, planar patterns 4*b*, 4*b'*, and 4*b'''*) are made ground patterns, and at least one power-supply pattern (for example planar pattern 4*b"*) and at least one ground pattern (for example, planar pattern 4*b*) are placed in confrontation, a capacitor can be formed between the two patterns (for example, planar patterns 4*b"* and 4*b*). When a capacitor is thus realized, impedance can be lowered and fluctuations in the power supply voltage can be suppressed and stabilized as the effect of this capacitor. Accordingly, consideration is preferably exercised and each of these planar patterns 4*b*, 4*b'*, 4*b"*, and 4*b'''* determined to be either a power-supply pattern or a ground pattern such that capacitors are formed having sufficient capacitance to obtain the effect of stabilizing the power supply voltage. FIG. 16 shows an example of the arrangement of conductive patterns 4 for forming capacitors of the desired capacitance for stabilizing the power supply voltage, but the present invention is of course not limited to this arrangement.

Dummy Pattern Formation

Figure 17:
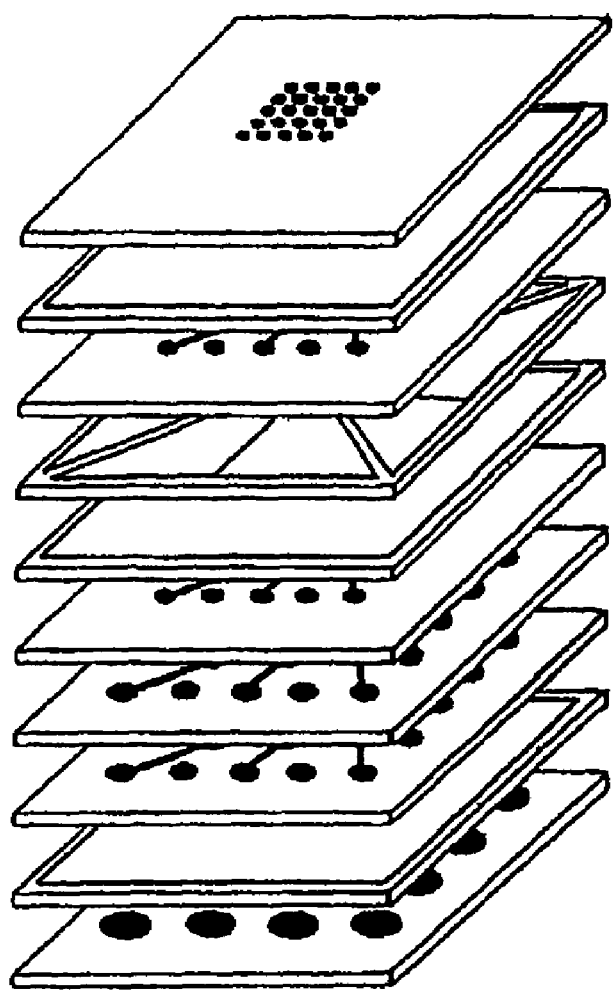
FIG. 17A is an exploded perspective view of the package substrate of the present invention.
FIG. 17B is a sectional view of the package substrate of the present invention.
Figure 17:
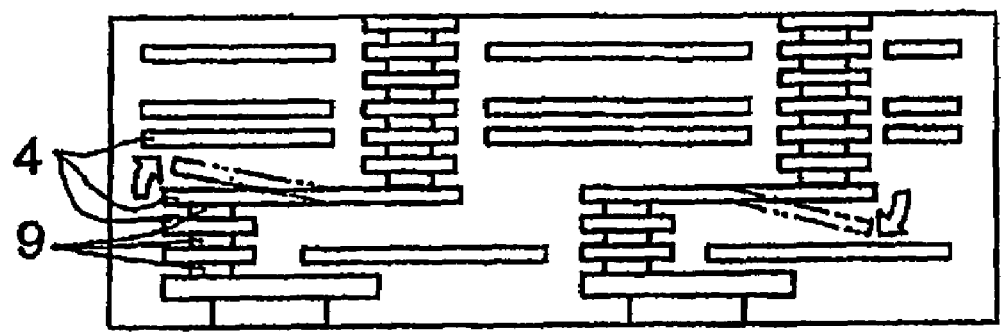

In the present invention, a multiplicity of film insulators 10 that are composed of thermoplastic resin are stacked and then collectively subjected to the application of heat and pressure to form multilayer board 1, and various conductive patterns 4 and vias 9 are formed in the inner-layer portion of this multilayer board 1. These conductive patterns 4 and vias 9 are formed based on a design that takes into consideration the electrical wiring conditions, but the potential exists for an imbalance in the planar distribution of the metal that is the material of these conductive patterns 4 and vias 9. For example, the potential exists for the occurrence of imbalance in the distribution of metal in one surface of a film insulator 10. The potential also exists for variation in the area ratio of metal in each surface for the surface of each film insulator 10. Thus, when the metal that forms conductive patterns 4 and vias 9 is scant in some portions and abundant in others as shown in FIGS. 17A and 17B, the application of pressure and heat to the collective multiplicity of film insulators 10 may result in a slight shift in the positions of each layer that accompanies the application of pressure and the softening of the thermoplastic resin. This shift in position occurs because metal acts as a reinforcement and withstands the pressure in locations where the metal that forms conductive patterns 4 and vias 9 is present (locations where metal is abundant), while the softened thermoplastic resin is unable to withstand the pressure and tends to deform in locations where metal that forms conductive patterns 4 and vias 9 is not present (locations where metal is scant). As a result, the potential exists for some portions of conductive patterns 4 to be deformed, have poor dimensional accuracy, and fail to obtain desired electrical connections (See FIG. 17B).

Figure 18A:
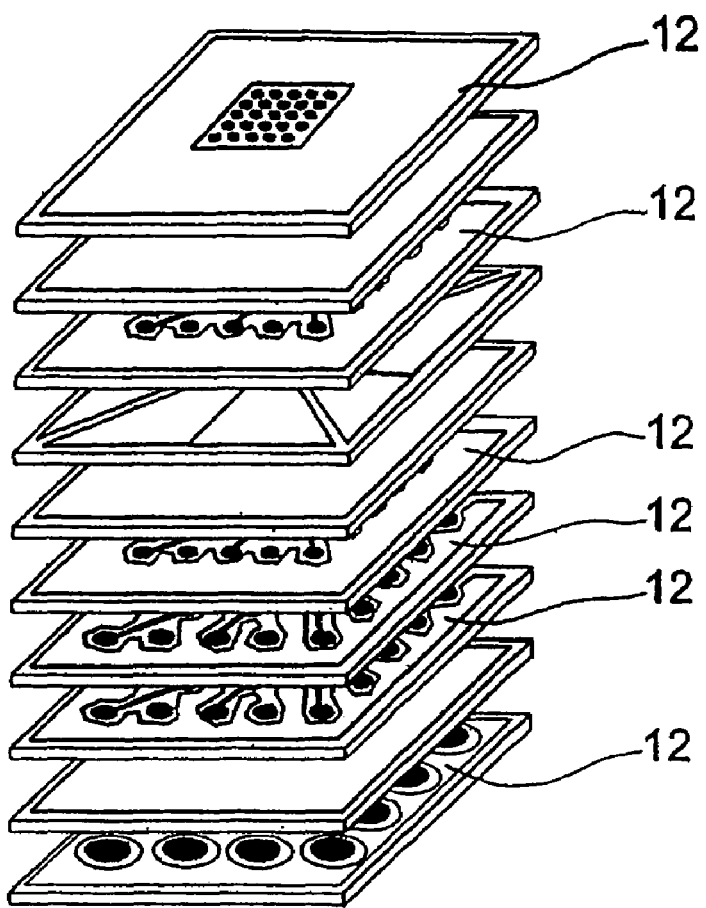
FIG. 18A is an exploded perspective view of the other package substrate of the present invention.
Figure 18B:
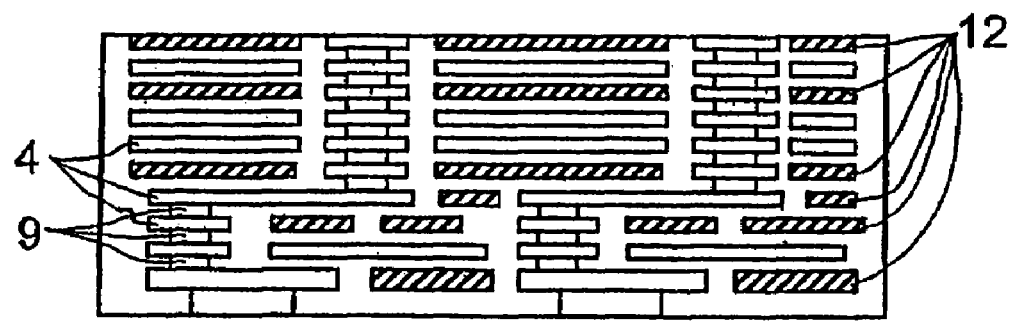
FIG. 18B is a sectional view of the other package substrate of the present invention.

In the present embodiment, however, as shown in FIGS. 18A and 18B, dummy patterns 12 that are made of metal (shown by hatching in FIG. 18B) are formed to correct imbalance in the distribution of metal within the surface of film insulators 10. At the same time, these dummy patterns 12 correct variations in the area ratio of metal over entire surface of film insulators 10 for each surface, and also correct variations in the area ratio of metal in any planar region in each surface. Thus, as shown in FIGS. 7 and 8, metal is for the most part distributed uniformly in multilayer board 1, and deformation can therefore be suppressed and dimensional accuracy maintained at a high level when pressure and heat are applied. Even if it is supposed that each film insulator 10 is slightly deformed during the application of heat and pressure, this deformation is generally uniform over the entire structure. As a result, local deformation of conductive patterns 4 (see FIG. 17B) does not occur, adverse effects upon electrical connections can be suppressed to a minimum, and connection reliability can be kept high. These dummy patterns 12 not only make the distribution of metal uniform, but by increasing the area ratio of metal, also contribute a reinforcement effect.

In particular, forming dummy patterns 12 in the vicinity of vias 9, which are relatively often formed in the same planar position over a multiplicity of layers, has the effect making the area ratio of metal uniform.

The above-described dummy patterns 12 are independent dummy patterns formed from metal that make no contribution to electrical connections, but all or a portion of these dummy patterns 12 can be electrically connected and used as ground patterns or power-supply patterns.

Formation of Venting Holes

A portion of conductive patterns 4 that are formed on film insulators 10 contact and are electrically conductive with vias 9 that pass through film insulators 10 in the direction of thickness. To ensure these electrical connections, conductive patterns 4 are typically formed over a relatively wide range so as to cover the end surfaces of vias 9. When conductive patterns 4 cover the end surfaces of vias 9 in this way, gas that is generated from vias 9 during the application of heat, for example, gas that results from the vaporization of volatile solvents that were added to metal that was embedded in through-holes 11 to form vias 9, is trapped in conductive pattern 4 and cannot be discharged to the outside. This collection of gas inside multilayer board 1 can cause problems such as an increase in internal stress or chemical deterioration. In the present invention, however, venting holes 13 are infallibly formed in conductive pattern 4 in the vicinity of vias 9.

Figure 6:
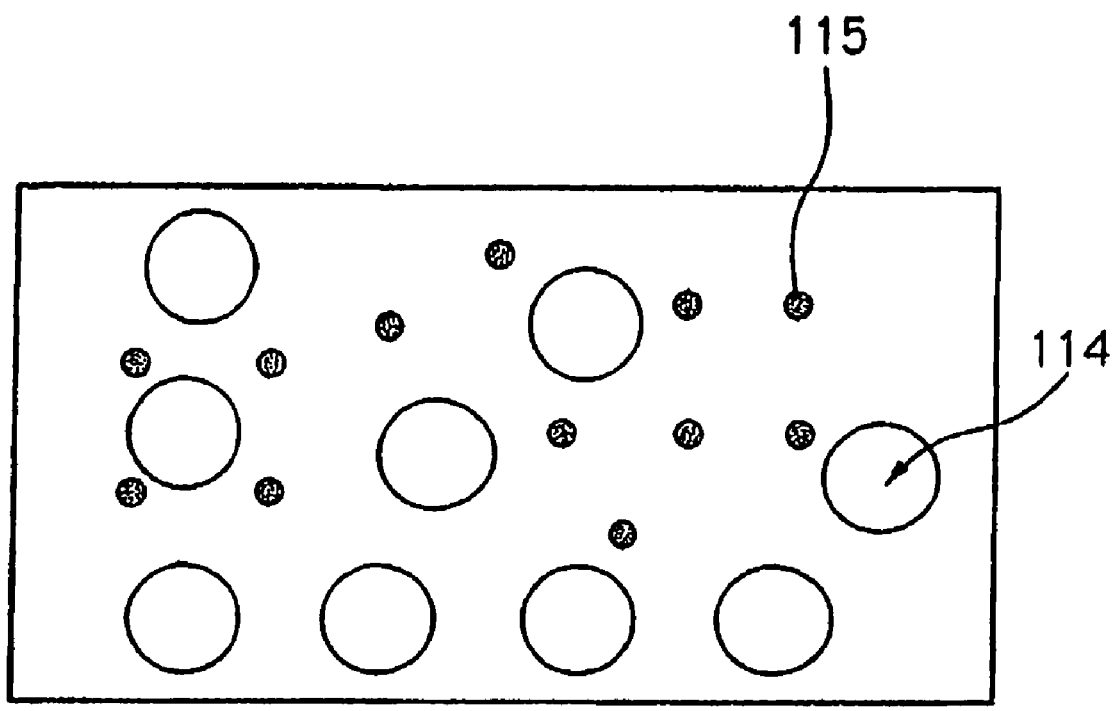
FIG. 6 is a plan view showing a planar conductive pattern of the package substrate of the prior art.
Figure 19B:
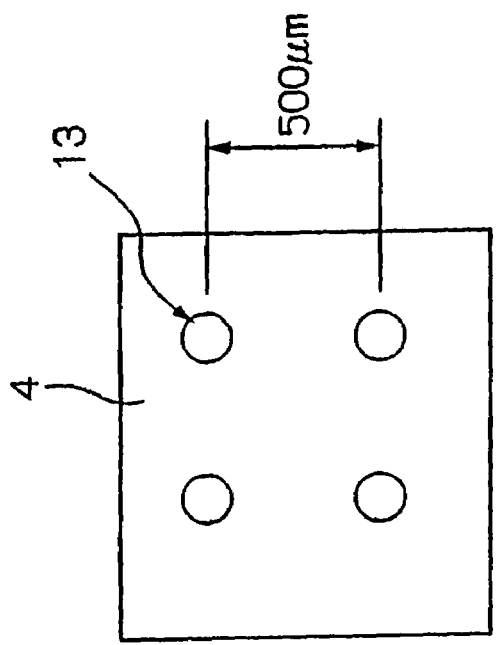
FIG. 19B is a plan view showing the planar conductive pattern outside the region surrounding a via of the package substrate of the present invention.
Figure 19A:
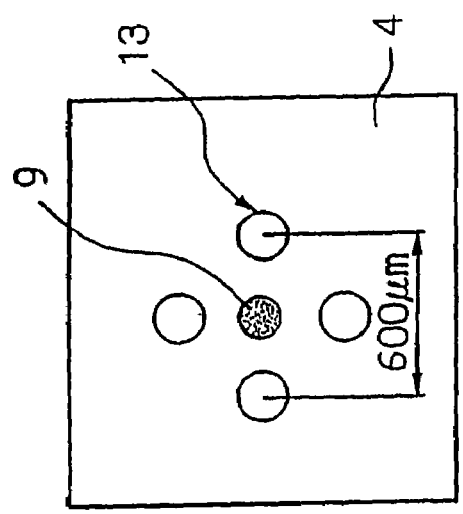
FIG. 19A is a plan view showing the planar conductive pattern in the region surrounding a via of the package substrate of the present invention.
Figure 19C:
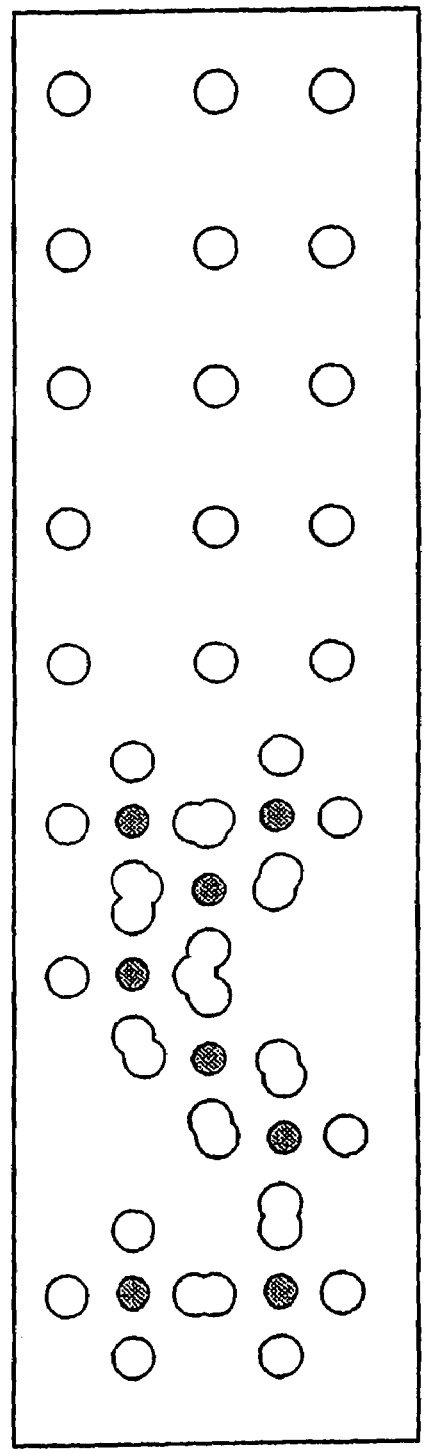
FIG. 19C is a plan view of the entire planar conductive pattern of the package substrate of the present invention.
Figure 20A:
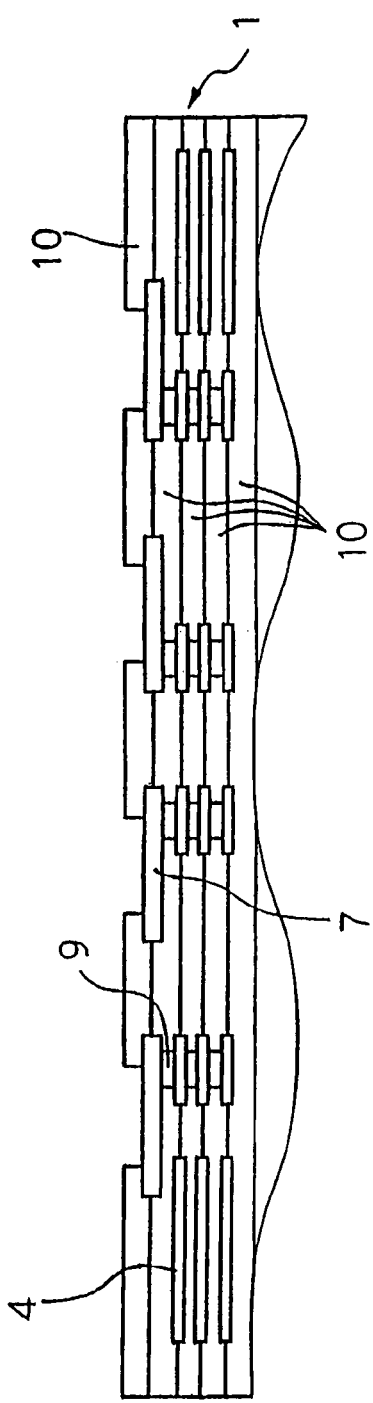
FIG. 20A is a sectional view of the vicinity of the outermost layer of the opposite side of the package substrate of the present invention.
Figure 20C:
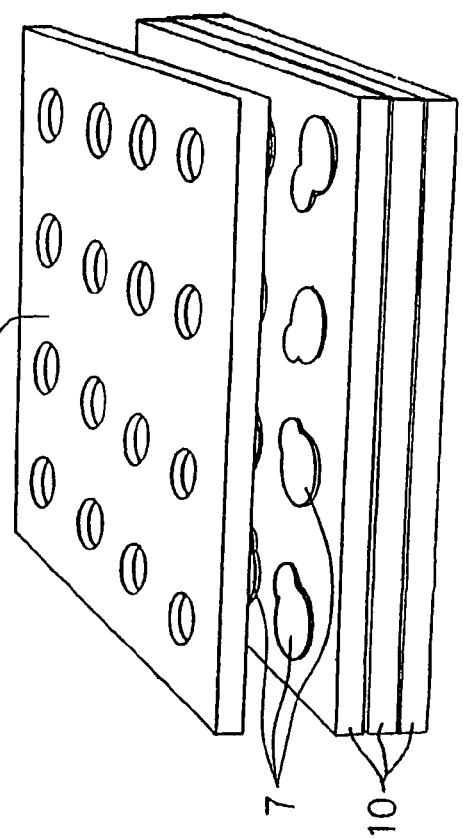
FIG. 20C is a partial exploded perspective view of the package substrate of the present invention.
Figure 20B:
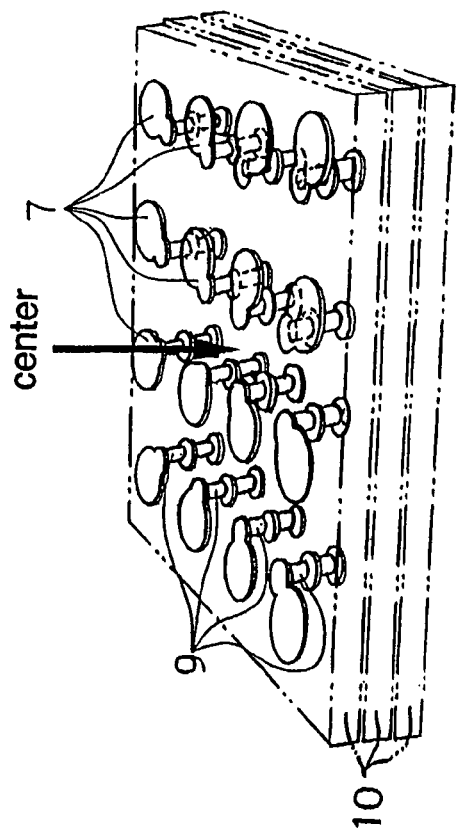
FIG. 20B is a perspective view of the package substrate of the present invention, that omits the thermoplastic resin layer of the outermost layer and shows by imaginary lines the thermoplastic resin layer that is positioned inside the omitted thermoplastic resin layer.
Figure 21:
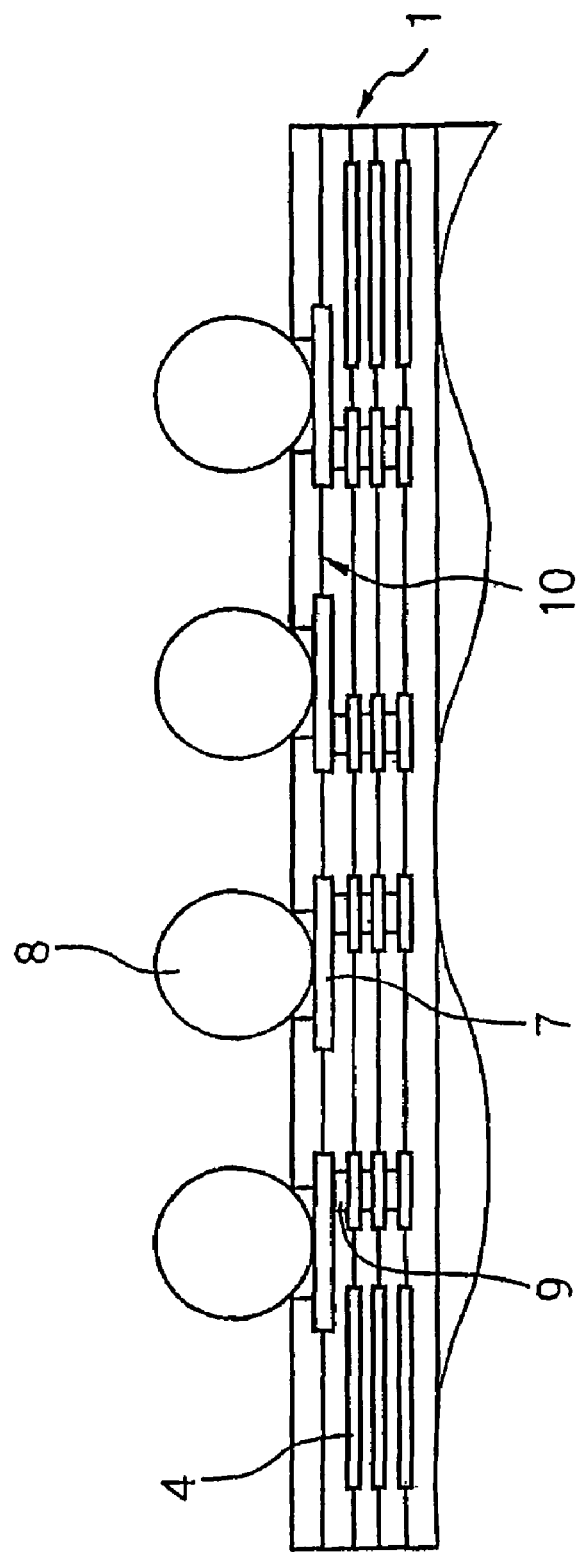
FIG. 21 is a sectional view of the vicinity of the outermost layer of the opposite side of the package substrate of the present invention.

In the prior art, constructions exist as shown in FIG. 6 in which a plurality of holes 114 having a diameter of, for example, 500 μm, are formed in conductive patterns having an area of a certain size. However, these holes 114 are arranged randomly or are arranged in a regular matrix, no particular consideration being given to the positional relation with vias 115 (shown as dots in FIG. 6). The present applicant, however, has given attention to the gas that is generated by the vaporization of solvents of vias 9 as previously described and that is blocked by conductive patterns 4 that cover the end surfaces of these vias 9, and, as shown in FIGS. 19A and 19C, has devised venting holes 13 that are infallibly formed in the vicinity of vias 9 (shown as dots in FIGS. 19A and 19C). Forming a plurality of holes having a diameter of, for example, 100 μm symmetrically around vias with vias as centers particularly in the vicinity of vias (for example, in a region within a circle having a radius of 300 μm) enables the effective and balanced discharge of gas such that gas does not remain in portions. In addition, a plurality of venting holes 13 are also preferably arranged in a matrix at a pitch of, for example, 500 μm in planar conductive patterns 4 that are provided in areas other than the vicinities of vias 9 as shown in FIGS. 19B and 19C, whereby the various gases that are generated from portions other than vias 9 can be discharged.

Arrangement of Vias

As previously described, in the present embodiment, connection terminals 6 are exposed to the outside on one outermost layer of multilayer board 1, and a pad-on-via construction is adopted in which vias 9 directly below these connection terminals 6 are connected to connection terminals 6 by direct contact. On the outermost layer of the opposite side of multilayer board 1, metal pads 7 on which ball terminals 8 are placed are exposed, and a pad-on-via construction is adopted in which vias 9 that are directly below these metal pads 7 connect to these metal pads 7 by direct contact. As shown in FIGS. 20A-20C and 21, vias 9 in the present invention are arranged so as to contact connection terminals 6 and metal pads 7 at positions that are toward the center of film insulators 10.

Figure 22:
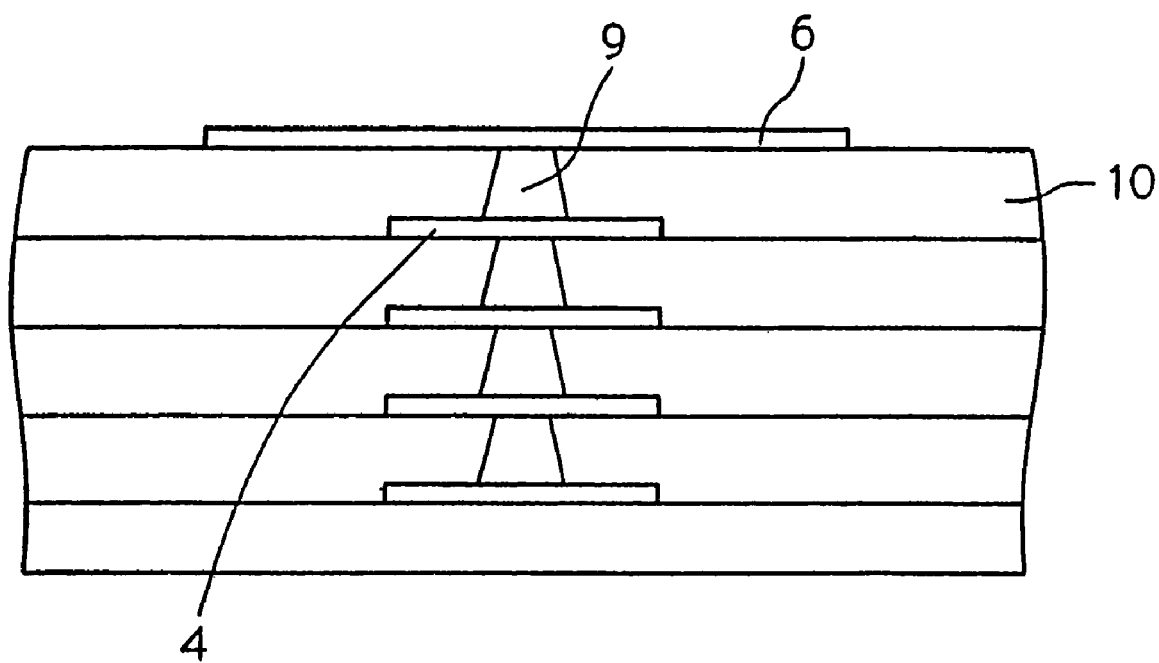
FIG. 22 is an enlarged sectional view showing an example of the relation between the relative positions of vias and connection terminals.

This point will be explained by taking the positional relation between vias 9 and connection terminals 6 on one outermost layer. If it is provisionally supposed that vias 9 are formed so as to contact the centers of connection terminals 6 as shown in FIG. 22, bumps 5 of LSI chip 2 will contact connection terminals 6, and the applied pressure will then be conveyed directly to vias 9 and therefore potentially cause damage to vias 9. For this reason, vias 9 are preferably formed away from the centers of connection terminals 6.

Figure 23A:
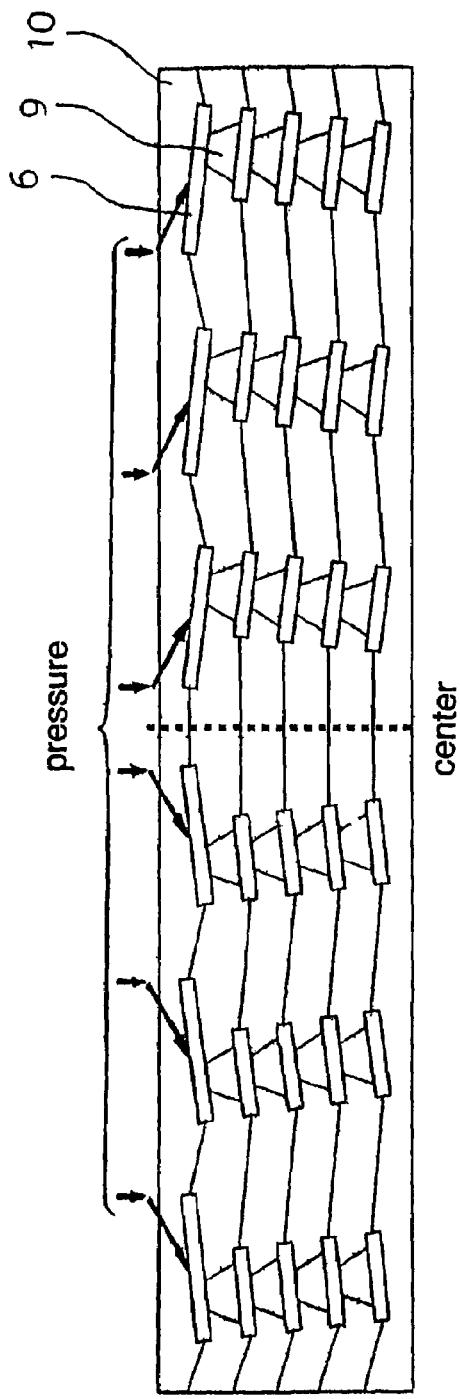
FIG. 23A is a sectional view showing another example of the relation of the relative positions of vias and connection terminals.
Figure 23B:
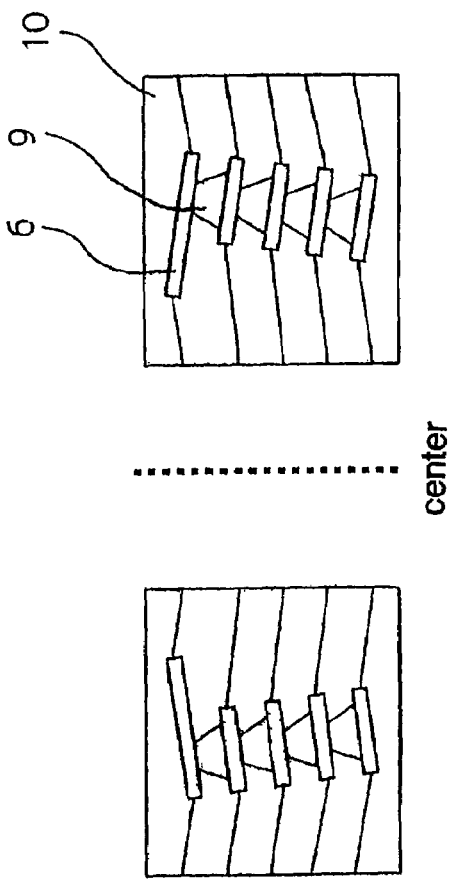
FIG. 23B is an enlarged view of the principal elements of FIG. 23A.

It is next provisionally supposed that vias 9 are arranged so as to contact positions of connection terminals 6 that are toward the periphery of film insulator 10, as shown in FIGS. 23A and 23B. When the plurality of film insulators 10 are stacked and collectively subjected to pressure and heat, force will normally be applied, as seen within the plane, from the central toward the peripheral sides of the entire stacked body, as shown in FIG. 23A. In other words, in the outermost layer, connection terminals 6 will first receive the force from the center of connection terminals 6, and these connection terminals 6 will then shift to slide in the softened thermoplastic resin. The force that shifts such that connection terminals 6 thus slide and the thermoplastic resin is pushed out to the outside is received by vias 9 that contact the peripheral-side ends of connection terminals 6, whereby vias 9 tilt toward the outside as shown enlarged in FIG. 23B. At this time, only softened thermoplastic resin is present on the outer side of vias 9, and this softened thermoplastic resin cannot support vias 9. As a result, the possibility arises that vias 9 will tilt, making the connection with connection terminals 6 unreliable. In addition, the tilt of vias 9 toward the outside raises the possibility that when planar conductive patterns 4 are present even more to the outside than connection terminals 6 that are positioned outermost, vias 9 that are tilted toward the outside will contact the outer conductive pattern 4 and cause electrical short circuits.

In the present embodiment, vias 9 are arranged so as to contact positions of connection terminals 6 that are toward the center of film insulator 10, as shown in FIGS. 24A-24B. Accordingly, when film insulators 10 are stacked and collectively subjected to pressure and heat, the central sides of the ends of connection terminals 6 and vias 9 first receive the force on the outermost layer. Even if connection terminals 6 should shift to slide as in the configuration that is shown in FIGS. 23A-23B, vias 9 support connection terminals 6 and suppress this shift. In addition, vias 9 act as a wedge in the softened thermoplastic resin and therefore suppress the shifting that presses toward the outside. On the other hand, the tilt of vias 9 toward the outside is suppressed by the support provided by the peripheral sides of the ends of connection terminals 6. In other words, in this configuration, vias 9 and connection terminals 6 (in particular, the peripheral sides of the end portions) provide mutual support and thus prevent deformation. As a result, the reliability of the connections between vias 9 and connection terminals 6 is high. In addition, because vias 9 do not tilt toward the outside, planar conductive patterns 4 can be formed in areas further toward the periphery than connection terminals 6 that are positioned closest to the periphery without the danger of causing electrical short circuits.

In the interest of simplifying the drawing, holes that are provided in the outermost layer of film insulators 10 for exposing connection terminals 6 have been omitted in FIGS. 23A-23B and 24A-24B. When holes (not shown) are deformed due to the tilting of vias 9 and the movement of thermoplastic resin as shown in FIGS. 23A-23B, the connections between external members (for example, bumps 5) and connection terminals 6 that are exposed by way of these holes may be compromised. However, a configuration that suppresses tilting of vias 9 and movement of the thermoplastic resin as in the embodiment of the present invention that is shown in FIGS. 24A-24B suppresses the deformation of the holes (not shown) and thus raises the reliability of the connections between outside members (such as bumps 5) and connection terminals 6 that are exposed by way of these holes.

Regarding the metal pads 7 and vias 9 on the outermost layer of the opposite side of multilayer board 1 that is shown in FIGS. 20A-20C and 21, vias 9 are again preferably arranged to contact positions of metal pads 7 that are toward the center of film insulator 10 for exactly the same reasons as explained above.

While preferred embodiments of the present invention have been described using specific terms, such description is for illustrative purposes only, and it is to be understood that changes and variations may be made without departing from the spirit or scope of the following claims.

What is claimed is:

1. A package substrate for a semiconductor device, comprising:
    a plurality of thermoplastic resin layers that are stacked and bonded together and that each have conductive vias that pass through the layers in a direction of thickness;
    conductive patterns that are composed of metal layers provided on at least one surface of said thermoplastic resin layers;
    connection terminals that are exposed on one outermost layer for mounting and electrically connecting an integrated circuit element of a flip-chip connection type; and
    conductive ball terminals that make up a ball grid array structure and that are exposed on the outermost layer of an opposite side, wherein
    said package substrate for a semiconductor device has sixteen or more said thermoplastic resin layers, and an overall thickness of said stacked and bonded thermoplastic layers is 0.8 mm-2.0 mm;
    one or more said vias are provided in each of all said thermoplastic resin layers or in all said thermoplastic resin layers other than the outermost layers; and
    seventeen or more layers of said conductive patterns are provided.

2. A package substrate for a semiconductor device according to claim 1, wherein said conductive patterns and said vias that contact these conductive patterns are connected by intermetallic compound bonding.

3. A package substrate for a semiconductor device, comprising:
    a plurality of thermoplastic resin layers that are stacked and bonded together and that each have conductive vias that pass through the layers in a direction of thickness;
    conductive patterns that are composed of metal layers provided on at least one surface of said thermoplastic resin layers;
    connection terminals that are exposed on one outermost layer for mounting and electrically connecting an integrated circuit element of a flip-chip connection type; and
    conductive ball terminals that make up a ball grid array structure and that are exposed on the outermost layer of an opposite side, wherein:
    a plurality of said connection terminals for flip-chip connection with said integrated circuit element is exposed on said one outermost layer and thermoplastic resin is interposed between each of said connection terminals, covering at least a portion of side surfaces of said connection terminals and preventing short circuits between said connection terminals; and
    a plurality of metal pads on which said ball terminals are respectively arranged is exposed on said outermost layer of the opposite side and thermoplastic resin is interposed between each of said metal pads, covering at least a portion of the side surfaces of said metal pads and preventing short circuits between said metal pads.

4. A package substrate for a semiconductor device according to claim 3, wherein:
    said connection terminals that are exposed on said one outermost layer contact said vias provided directly below these connection terminals and electrically connect to said conductive patterns by way of these vias; and
    a plurality of metal pads on which said ball terminals are respectively arranged is exposed on said outermost layer of the opposite side, and these metal pads contacting said vias provided directly below these metal pads and electrically connecting with said conductive pattern by way of the vias.

5. A package substrate for a semiconductor device according to claim 3, wherein at least three layers of said conductive patterns are electrically connected by at least two said vias that are positioned in alignment in a column in the direction of thickness at the same planar position of at least two said thermoplastic resin layers.

6. A package substrate for a semiconductor device according to claim 3, wherein all said thermoplastic resin layers, or all said thermoplastic resin layers other than the outermost layers, have said vias provided at the same planar position and make up an electrically connected structure in which these vias are arranged in alignment in a column in the direction of thickness through all said thermoplastic resin layers.

7. A package substrate for a semiconductor device according to claim 3, wherein the linear expansion coefficient in the direction of thickness of each said thermoplastic resin layer is 140 ppm or less, and the linear expansion coefficient in the direction parallel to said surface of each said thermoplastic resin layer is 40 ppm or less.

8. A package substrate for a semiconductor device according to claim 3, wherein the product of the linear expansion coefficient and modulus of elasticity of each said thermoplastic resin layer is 0.6 MPa/° C. or less in the direction of thickness, and 0.18 MPa/° C. or less in the direction parallel to said surface.

9. A package substrate for a semiconductor device according to claim 3, wherein said thermoplastic resin layers are any one of, or a mixture containing at least one of: polyetheretherketone, polyetherimide, liquid crystal polymer, polyphenylene sulfide, thermoplastic polyimide, polyethersulfone, polyphenylene ether, and syndiotactic polystyrene.

10. A package substrate for a semiconductor device according to claim 3, wherein:
said conductive patterns include a micro signal-wiring pattern and planar patterns that are formed with a greater area than said signal-wiring pattern;
a portion of said signal-wiring pattern has a planar overlap with the planar pattern that is positioned in an upper layer than said signal-wiring pattern and the planar pattern that is positioned at a lower layer and is in a position interposed between said two planar patterns;
one or both of said two planar patterns that have a planar overlap with said signal-wiring pattern is formed on a surface that is separated by at least the thickness of two layers of said thermoplastic resin in the direction of thickness from the surface of said thermoplastic resin layer on which said signal-wiring pattern is formed;
at least one surface that is an intermediate layer exists between the surface on which said signal-wiring pattern is formed and the surface on which said planar pattern is formed and which is separated by at least the thickness of two layers of said thermoplastic resin;
a conductive pattern is not formed in an area of the surface that is said intermediate layer, that is interposed between said signal-wiring pattern and said planar pattern, and a planar pattern is formed outside said area of the surface that is said intermediate layer; and
a planar pattern that is not directly connected to said signal-wiring pattern is formed outside said signal-wiring pattern on a surface on which said signal-wiring pattern is formed.

11. A package substrate for a semiconductor device according to claim 10, wherein:
at least one of the pair of said planar patterns that have a planar overlap with a portion of said signal-wiring pattern, said planar pattern that is formed on a surface that is said intermediate layer, and said planar pattern that is formed outside said signal-wiring pattern, is a power-supply pattern, and the others of said planar patterns are ground patterns; and
at least one said power-supply pattern and at least one said ground pattern confront each other and form a capacitor.

12. A package substrate for a semiconductor device according to claim 3, wherein a ground pattern, a power-supply pattern, or a dummy pattern made of metal that is isolated and that makes no contribution to electrical connections, is formed on the surface of at least one of said thermoplastic resin layers for correcting imbalance in the distribution of metal in the surface.

13. A package substrate for a semiconductor device according to claim 3, wherein a ground pattern, a power-supply pattern, or a dummy pattern made of metal that is isolated and that makes no contribution to electrical connections, is formed on the surface of at least one said thermoplastic resin layer for correcting variations, for each of said surfaces, in the proportion of the area of the metal over the entire surfaces of said thermoplastic resin layers and in the proportion of the area of metal in any planar region in the surfaces of said thermoplastic resin layers.

14. A package substrate for a semiconductor device according to claim 12, wherein said ground pattern, power-supply pattern, or dummy pattern made of metal is formed at least in the vicinity of said vias.

15. A package substrate for a semiconductor device according to claim 13, wherein said ground pattern, power-supply pattern, or dummy pattern made of metal is formed at least in the vicinity of said vias.

16. A package substrate for a semiconductor device according to claim 3, wherein a plurality of venting holes is provided in said planer conductive patterns that are provided in the vicinities of said vias of said thermoplastic resin layers, these venting holes being arranged symmetrically with said vias as centers.

17. A package substrate for a semiconductor device according to claim 16, wherein a plurality of venting holes is provided in said planar conductive patterns that are provided in portions outside the vicinities of said vias, these venting holes being arranged in matrix form.

18. A package substrate for a semiconductor device according to claim 16, wherein the vicinities of said vias are areas within circle having a radius of 300 µm with said vias as centers.

19. A package substrate for a semiconductor device according to claim 17, wherein the vicinities of said vias are areas within circles having a radius of 300 µm with said vias as centers.

20. A package substrate for a semiconductor device according to claim 3, wherein:
said vias that connect to said connection terminals that are exposed on said one outermost layer are arranged so as to contact positions of said connection terminals that are toward the center of said thermoplastic resin layer; and
vias, which connect to metal pads on which said ball terminals are placed that are exposed on said outermost layer of the opposite side, are arranged so as to contact positions of said metal pads that are toward the center of said thermoplastic resin layer.

21. A semiconductor device, comprising:
a package substrate for a semiconductor device according to claim 3;
an integrated circuit element of the flip-chip connection type that is mounted on said one outermost layer and that is electrically connected to said connection terminals; and
an external board that is attached to said outermost layer of the opposite side and that is electrically connected to said ball terminals.

* * * * *